(12) United States Patent
Andoh

(10) Patent No.: US 6,639,301 B2
(45) Date of Patent: Oct. 28, 2003

(54) SEMICONDUCTOR DEVICE AND MANUFACTURING METHOD THEREOF

(75) Inventor: Hideyuki Andoh, Saitama-ken (JP)

(73) Assignee: Sanken Electric Co., Ltd., Saitama-ken (JP)

(*) Notice: Subject to any disclaimer, the term of this patent is extended or adjusted under 35 U.S.C. 154(b) by 0 days.

(21) Appl. No.: 10/015,412

(22) Filed: Dec. 11, 2001

(65) Prior Publication Data

US 2002/0070380 A1 Jun. 13, 2002

(30) Foreign Application Priority Data

Dec. 12, 2000 (JP) .................................. 2000-377387

(51) Int. Cl.[7] .................. H01L 29/866; H01L 29/868
(52) U.S. Cl. .................... 257/606; 257/605; 257/655
(58) Field of Search .............................. 257/655, 605, 257/606

(56) References Cited

U.S. PATENT DOCUMENTS

| | | | |
|---|---|---|---|
| 4,419,681 A | * 12/1983 | Schmitz | ...................... 257/606 |
| 4,484,206 A | * 11/1984 | Moroshima et al. | ........ 257/606 |
| 6,075,276 A | * 6/2000 | Kitamura | .................... 257/481 |

* cited by examiner

Primary Examiner—Jerome Jackson
(74) Attorney, Agent, or Firm—Kilpatrick Stockton LLP

(57) ABSTRACT

A semiconductor device embraces an n-type first semiconductor region, defined by first and second end surfaces and a first outer surface connecting the first and second end surfaces; a p-type second semiconductor region, defined by third and fourth end surfaces and a second outer surface connecting the third and fourth end surfaces, the fourth end surface is in contact with the first end surface; an n-type third semiconductor region connected with the first semiconductor region at the second end surface; a p-type fourth semiconductor region connected with the second semiconductor region at the third end surface; and a fifth semiconductor region having inner surface in contact with the first and second outer surfaces and an impurity concentration lower than the first semiconductor region. The fifth semiconductor region surrounds the first and second semiconductor regions and is disposed between the third and fourth semiconductor regions.

14 Claims, 13 Drawing Sheets

SEMICONDUCTOR DEVICE AND MANUFACTURING METHOD THEREOF

BACKGROUND OF THE INVENTION

1. Field of the Invention

This invention relates to a semiconductor device such as a semiconductor diode and its manufacturing method.

2. Description of the Related Art

A voltage regulator diode (a semiconductor diode) 1 shown in FIG. 1 is known. The semiconductor diode (hereinafter referred as "an earlier semiconductor diode") 1 has, e.g. a simple three-layer structure stacked in such a way that an n-type semiconductor layer 2 having high impurity concentration, an n-type semiconductor layer 3 and a p-type semiconductor layer 4 having high impurity concentration are stacked sequentially on a silicon substrate. Metal films 5 and 6 to make electrodes are respectively formed on main surfaces of the n-type semiconductor layer 2 and the p-type semiconductor layer 4.

There exists usually a strong electric field in a depletion layer of a pn junction applied of reverse bias voltage for the earlier semiconductor diode 1 having the above junction structure and the electric field gets stronger locally and susceptible to occur breakdown under influence of impurity elements and ions attached on its surface at a chip side where end portions of the pn junction emerge. Therefore, it can often be hard to gain a reverse breakdown voltage expected theoretically for the earlier semiconductor diode 1. To reduce the electric field on the chip side, the bevel contour to machine aslant by an appropriate angle to the pn junction interface 9 for reducing the electric field is adopted. By adopting such the bevel contour, the electric field at the chip outer-surface 7 is reduced and breakdown over the whole face of the junction inside the semiconductor is made to occur to stabilize the breakdown behavior. For semiconductor devices having breakdown voltage higher than the voltage regulator diode, it is known that the breakdown voltage can be improved by adopting the bevel structure.

SUMMARY OF THE INVENTION

The earlier semiconductor diode 1, however, has problems as explained below:

(a) For the earlier semiconductor diode 1, to protect the chip outer-surface 7 from the effects of outside environment in an assembling process the chip outer-surface 7 is coated with an insulation film 8 as shown in FIG. 1 after employing wet cleaning by acid or alkali chemicals. However, for the semiconductor diode manufactured in such a way, it is pointed out from the result of product evaluation tests that performance and quality of the product is not stable. The reasons for instability in the performance are given that changes in the surface state and surface failure occur on the chip outer-surface 7 under influence of the wet cleaning or coating of the insulation film 8. Since the surface state of actual semiconductor chips is very active, it is very difficult to control the precision and reproducibility of such surface state.

(b) The earlier semiconductor diode 1 has the n-type semiconductor layer 3 having impurity concentration much lower than that of the p-type semiconductor layer 4, and in the case that it can be considered a one-sided abrupt junction, avalanche breakdown voltage at the pn junction part of the n-type semiconductor layer 3 with the p-type semiconductor layer 4 is determined by impurity concentration of the n-type semiconductor layer 3. Accordingly, it was required to control highly accurately resistivity $\rho$ of a semiconductor (silicon) wafer to be used for a product. This means that a semiconductor wafer regulated in a strict specification for the resistivity $\rho$ was required to be manufactured by a semiconductor wafer manufacturer under a special order and tested after the delivery. In the past, silicon wafers with a narrow range of 0.01 to 0.03 $\Omega \cdot$cm in resistivity $\rho$—for the n-type silicon, it corresponds with a range of $5 \times 10^{18}/\text{cm}^3$ to $7 \times 10^{17}/\text{cm}^3$ in impurity concentration—were used for the order specification.

(c) For manufacturing of the earlier semiconductor diode 1, since the chip outer-surface 7 has the bevel structure formed aslant to the pn junction interface, there is a problem that the number of processes required increases since processes such as sandblasting, grinding, polishing or etching are added in order to form the bevel structure.

(d) For the earlier semiconductor diode 1, since the chips cut from the semiconductor wafer are in a packed state and have its side face inclined aslant to the front and back surfaces of the chips, the device geometry makes it difficult to mount the chip on a jig such as collet in an assembling process.

In view of these situations, it is an object of the present invention to provide a semiconductor device having a desired stable breakdown voltage, preventing occurrence of a local breakdown on a semiconductor (chip) side face where the pn junction emerges.

More specifically, the present invention would provide a semiconductor device and its manufacturing method capable of extending a range of resistivity $\rho$ of the semiconductor wafer to be originally prepared for manufacturing and lowering cost for the semiconductor wafer.

Another object of the present invention is to provide a manufacturing method for semiconductor device capable of simplifying or omitting chip surface treatment.

Still another object of the present invention is to provide a semiconductor device and its manufacturing method capable of simplifying production process.

Yet still another object of the present invention is to provide a semiconductor device allowing for favorable handling and favorable loading of the chip into a jig, such as the collet, during the product assembly process.

To achieve the above-mentioned objects, the first aspect of the present invention inheres in a semiconductor device embracing (a) a first semiconductor region of a first conductivity type, defined by a first end surface, a second end surface opposing to the first end surface and a first outer surface connecting the first and second end surfaces; (b) a second semiconductor region of the second conductivity type, defined by a third end surface, a fourth end surface opposing to the third end surface and a second outer surface connecting the third and fourth end surfaces, the fourth end surface is in contact with the first end surface; (c) a third semiconductor region of the first conductivity type connected with the first semiconductor region at the second end surface; (d) a fourth semiconductor region of the second conductivity type connected with the second semiconductor region at the third end surface; and (e) a fifth semiconductor region having inner surface in contact with the first and second outer surfaces and an impurity concentration lower than the first semiconductor region, configured such that the fifth semiconductor region surrounds the first and second semiconductor regions, the fifth semiconductor region is disposed between the third and fourth semiconductor regions. Here, the first conductivity type and the second conductivity type are conductivity types opposite to each other. That is, the second conductivity type is the p-type if the first conductivity type is assigned to be n-type and the second conductivity type is n-type if the first conductivity type is p-type.

According to the semiconductor device of the first aspect of the present invention, the first and the second semiconductor regions are stacked with each other in such a way that they implement a localized pn junction interface (hereinafter referred as "first pn junction interface"). Another pn junction interface (hereinafter referred as "second pn junction interface") is formed between the fourth semiconductor region and the fifth semiconductor region. Since the impurity concentration of the first semiconductor region is higher than that of the fifth semiconductor region, the first pn junction interface is more susceptible to cause breakdown than the second pn junction interface positioned on the peripheral side of the semiconductor device. Accordingly, since the electrical field on a chip outer-surface of the semiconductor device is relatively reduced so that breakdown occurs at the junction interface inside the semiconductor device, the breakdown behavior can be stabilized. The methodology for stabilizing the breakdown behavior in such a way is effective also in a power semiconductor device having the maximum operation voltage higher than the voltage regulator diode for example.

In the first aspect of the present invention, the outer surface of the fifth semiconductor region can serve as a chip outer-surface of the semiconductor device to make the chip outer-surface substantially perpendicular to the second end surface of the first semiconductor region. That is because the electrical field in the second pn junction interface emerged on the chip outer-surface of the semiconductor device is reduced and less changes are made in breakdown voltage of the semiconductor device even when a change in surface state of the chip outer-surface of the semiconductor device and small surface failures occur. Hence, the beveled junction termination architecture is not required. That is, since the breakdown occurs at the first pn junction interface part deep inside the semiconductor device without adopting the bevel contour at the chip outer-surface of the semiconductor device, the breakdown behavior can be stabilized. Therefore, the outer-surface of the semiconductor device can be cut, or diced using conventional diamond blades. Additionally, the outer-surface of the semiconductor device can be formed so that it is perpendicular to the first main surface of the semiconductor substrate, resulting in improved handling of the semiconductor device (chip).

In the first aspect of the present invention, it is preferable that the fifth region is a semiconductor substrate made of wafer cut from bulk crystal such as an FZ method, a CZ method, and an MCZ method. If impurity concentration of the first semiconductor region is much lower than the second semiconductor region and the localized first pn junction between the first semiconductor region with the second semiconductor region can be considered a one-sided abrupt junction, the avalanche breakdown voltage of the localized first pn junction is determined by impurity concentration of the first semiconductor region independently from the impurity concentration of the fifth semiconductor region. And if it is a double-sided abrupt junction, the avalanche breakdown voltage of the localized first pn junction is determined by impurity concentrations of both the first and the second semiconductor regions independently from the impurity concentration of the fifth semiconductor region. Accordingly, since the impurity concentration of the fifth semiconductor region can be regulated as the original (initial) impurity concentration of the semiconductor substrate used as a raw material, it is not required to prescribe strictly the impurity concentration of the substrate and hence a selection range of the semiconductor substrate to be used can be extended. There is no need to order a semiconductor substrate (wafer) with special specifications and it enables users to lower the cost and shorten the time required to purchase the semiconductor substrate (wafer) as the raw material.

In the first aspect of the present invention, it is preferable that the first main electrode layer is formed on the bottom surface of the third semiconductor region and that the second main electrode is formed on the top surface of the fourth semiconductor region. Operation regions to serve as a current path for a main current of the semiconductor element are defined between the first main electrode layer and the second main electrode layer. The "first main electrode layer" can be identified as either an anode electrode layer or a cathode electrode in a semiconductor diode and a thyristor. The thyristor can be a GTO thyristor and an static induction thyristor (SI thyristor). If the third semiconductor region is assigned to be the n-type, the first main electrode is the cathode electrode layer. The "second main electrode layer" can be identified as either a cathode electrode layer or an anode electrode layer not being assigned as the first main electrode layer in the semiconductor diode and the thyristor. If the fourth semiconductor region is assigned to be the p-type, the second main electrode is identified as the anode electrode layer. As a result, the third semiconductor region serves as the "first main electrode region" being contacted with first main electrode layer, and the fourth semiconductor region serves as the "second main electrode region" being contacted with second main electrode layer.

Furthermore, the "first main electrode layer" can be identified as either an emitter electrode layer or a collector electrode layer in a bipolar transistor (BJT) or an IGBT. The bipolar transistor can be an ultra high-frequency transistor that operates in microwave band, millimeter wave band or sub-millimeter wave band such as a heterojunction bipolar transistor (HBT). The present invention can also be applied to an IGFET such as an MOSFET, an MOSSIT or a high electron mobility transistor (HEMT). For the IGFET, the "first main electrode layer" can be identified as either a source electrode layer or a drain electrode layer. The "second main electrode layer" can be identified as either an emitter electrode layer or a collector electrode that will not be assigned as the first main electrode layer for the BJT and the IGBT, and either a source electrode layer or a drain electrode layer, which will not become the first main electrode layer for the IGFET. For the BJT, the IGBT and the IGFET, a control layer such as a base electrode layer or a gate electrode layer is naturally added.

The second aspect of the present invention inheres in a semiconductor device embracing (a) a first semiconductor region of a first conductivity type, defined by a first end surface, a second end surface opposing to the first end surface and a first outer surface connecting the first and second end surfaces; (b) a second semiconductor region of the second conductivity type, defined by a third end surface, a fourth end surface opposing to the third end surface and a second outer surface connecting the third and fourth end surfaces, the fourth end surface is in contact with the first end surface; (c) a third semiconductor region of the first conductivity type connected with the first semiconductor region at the second end surface; (d) a fourth semiconductor region of the second conductivity type connected with an upper part of the second outer surface near the third end surface; and (e) a fifth semiconductor region having inner surface in contact with the first and second outer surfaces and an impurity concentration lower than the first semiconductor region, configured such that the fifth semiconductor region surrounds the first and second semiconductor regions, the fifth semiconductor region is disposed between the third and fourth semiconductor regions.

Similar to the first aspect, in the semiconductor device of the second aspect of the present invention, the first semiconductor region and the second semiconductor region are stacked with each other in such a way that they implement the localized first pn junction interface. The second pn junction interface is formed between the fourth semiconductor region and the fifth semiconductor region. Since the impurity concentration of the first semiconductor region is higher than that of the fifth semiconductor region, the first pn junction interface is more susceptible to cause breakdown than the second pn junction interface positioned on the peripheral side of the semiconductor device. Accordingly, since the electrical field on a chip outer-surface of the semiconductor device is relatively reduced so that breakdown occurs at the junction interface inside the semiconductor device, the breakdown behavior can be stabilized.

The third aspect of the present invention inheres in a method of manufacturing a semiconductor device embracing (a) preparing a semiconductor substrate defined by a first main surface a second main surface opposing to the first main surface; (b) forming a first semiconductor region by selectively doping first conductivity type impurity elements through a first diffusion window disposed on the second main surface to a predetermined diffusion depth; (c) forming a second semiconductor region so as to form a pn junction with the first semiconductor region, by selectively doping second conductivity type impurity elements through a second diffusion window having area larger than the first diffusion window, the second diffusion window disposed on the second main surface; (d) forming a third semiconductor region by doping the first conductivity type impurity elements through entire first main surface; and (e) forming a fourth semiconductor region by doping the second conductivity type impurity elements through entire second main surface.

According to the third aspect of the present invention, the first semiconductor and the second semiconductor regions can be formed inside the semiconductor substrate by doping selectively the impurity elements from the second main surface of the semiconductor substrate. The second pn junction interface formed by the fifth semiconductor region and the fourth semiconductor region emerges on a chip outer-surface of the semiconductor device. Since the impurity concentration of the first semiconductor region implementing the first pn junction interface has impurity concentration higher than that of the first conductivity type fifth semiconductor region, breakdown will occur in the first pn junction interface earlier to the second pn junction interface. The breakdown behavior can be stabilized by reducing an electrical field at the chip outer-surface of the semiconductor device in such a way to induce breakdown at the junction part deep inside the semiconductor device. And since the fifth semiconductor region can be used as the original impurity concentration of the semiconductor substrate by adjusting the impurity concentration of the first semiconductor region, it is not required to prescribe strictly the impurity concentration of the substrate and hence a selection range of the semiconductor substrate to be used can be extended.

The fourth aspect of the present invention inheres in a method of manufacturing a semiconductor device embracing (a) preparing a semiconductor substrate defined by a first main surface a second main surface opposing to the first main surface; (b) forming a first semiconductor region by selectively doping first conductivity type impurity elements through a first diffusion window disposed on the first main surface to a predetermined diffusion depth; (c) forming a second semiconductor region so as to form a pn junction with the first semiconductor region, by selectively doping second conductivity type impurity elements through a second diffusion window disposed on the second main surface; (d) forming a third semiconductor region by doping the first conductivity type impurity elements through entire first main surface; and (e) forming a fourth semiconductor region by doping the second conductivity type impurity elements through entire second main surface. Here, whichever can be employed in first of the process sequence to form either the first semiconductor region or the second semiconductor region. And whichever can be employed in first of the process sequence to form either the third semiconductor region or the fourth semiconductor region.

According to the fourth aspect of the present invention, the fourth and the second semiconductor regions are diffused into the semiconductor substrate along mutually opposite directions. Therefore, there will be no problem such as the compensation of the first and second conductivity type impurity elements, and the first and second conductivity type impurity concentrations of each semiconductor regions are easily controlled compared to the semiconductor device manufactured by the method of the third aspect.

The fifth aspect of the present invention inheres in a method of manufacturing a semiconductor device embracing (a) preparing a semiconductor substrate defined by a first main surface a second main surface opposing to the first main surface; (b) forming a third semiconductor region by doping first conductivity type impurity elements through entire first main surface; (c) forming a fourth semiconductor region by doping the second conductivity type impurity elements through entire second main surface; (d) forming a first diffusion trench penetrating through the third semiconductor region from a part of the first main surface; (e) forming a second diffusion trench penetrating through the fourth semiconductor region from a part of the second main surface; (f) forming a first semiconductor region by doping selectively the first conductivity type impurity elements from inner wall and bottom of the first diffusion trench, and (g) forming a second semiconductor region by doping selectively the second conductivity type impurity elements from inner wall and bottom of the second diffusion trench. Here, whichever can be employed in first of the process sequence to form either the first semiconductor region or the second semiconductor region. And whichever can be employed in first of the process sequence to form either the first diffusion trench or the second diffusion trench. Furthermore, whichever can be employed in first of the process sequence to form either the third semiconductor region the fourth semiconductor region. And furthermore, processes to form the third semiconductor region and the fourth semiconductor region can be employed after processes to form the first semiconductor region and the second semiconductor region.

In the fifth aspect of the present invention, since the first and the second semiconductor regions are formed in the semiconductor substrate via the first and the second diffusion trenches, high temperature and long time thermal diffusion treatments are not needed and leads to productivity improvement. Crystal defect resulting from the high temperature and long time thermal diffusion treatment will not occur. Since relatively shallow diffusion is required compared with the methods of third and fourth aspects, impurity concentrations of the first semiconductor region and the second semiconductor region can be easily controlled. And by forming the first main electrode plug and the second main electrode plug with materials having high electric conductivity inside the first and the second diffusion trenches, influence of parasitic resistance can be reduced to provide a voltage regulator diode with higher accuracy. In particular, since the metal electrode layers can contact with the semiconductor regions in wide areas, the contact resistances at the ohmic contacts can be lowered.

In the third through fifth aspects of the present invention, it is preferable to manufacture many semiconductor devices simultaneously on a semiconductor wafer, or on the semiconductor substrate, after dividing the semiconductor wafer by cutting with planes substantially perpendicular to the first main surface so as to obtain many semiconductor chips. In this case, each chip can be stored and carried in a state being stuck to synthetic resin sheet by sticking the synthetic resin sheet to whichever main surface side of the semiconductor substrate to cut the chip so that the synthetic resin sheet is not cut. When packaged and assembled into the product, the semiconductor device in a state of being a chip, which is stuck to the synthetic resin sheet, can be used. Hence, it enables easy handling. Furthermore, since the outer-surface of the semiconductor device (semiconductor chip) is perpendicular to the first main surface of the semiconductor substrate, handling by a jig such as a collet will also be easy.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the present invention in practice.

DETAILED DESCRIPTION OF THE EMBODIMENTS

Figure 1A:
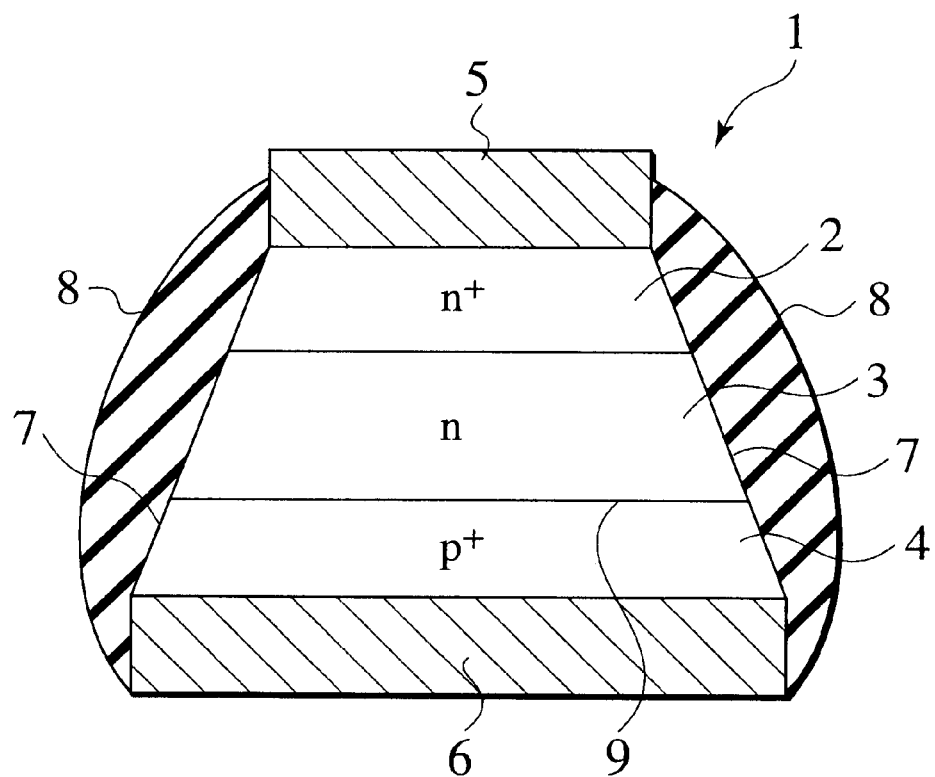
FIG. 1 is a cross-sectional view showing an earlier semiconductor device.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings. In the following description specific details are set fourth, such as specific materials, process and equipment in order to provide thorough understanding of the present invention. It will be apparent, however, to one skilled in the art that the present invention may be practiced without these specific details. In other instances, well-known manufacturing materials, process and equipment are not set forth in detail in order not unnecessary obscure the present invention.

Prepositions, such as "on", "over" and "under" are defined with respect to a planar surface of the substrate, regardless of the orientation the substrate is actually held. A layer is on another layer even if there are intervening layers. It being understood the indicator "+" in the Figures indicates relatively strong doping and the indicator "−" in the Figures indicates relatively weak doping.

(First Embodiment)

Figure 2A:
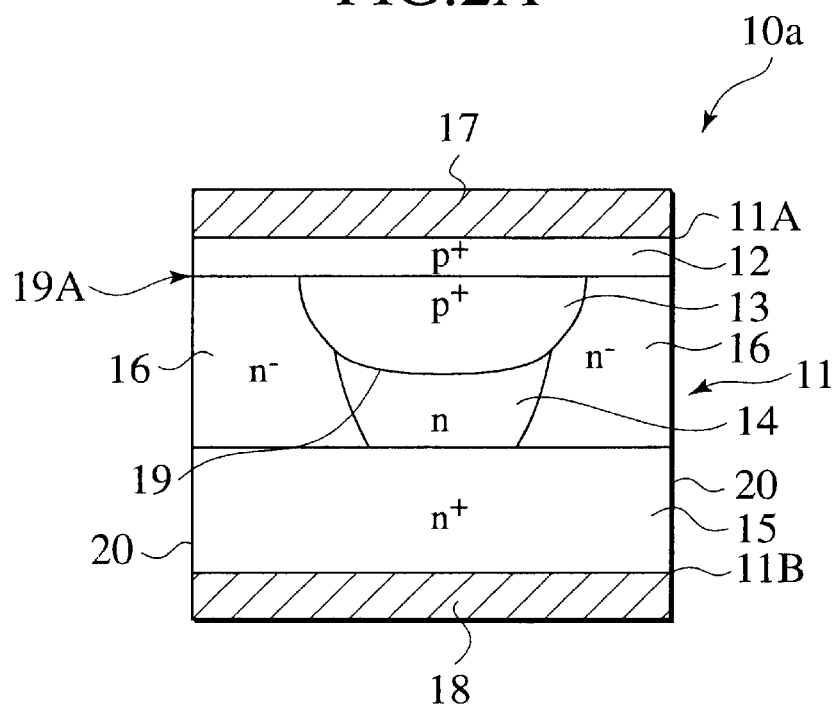
FIG. 2A is a cross-sectional view showing a semiconductor device according to the first embodiment of the present invention.

FIG. 2A is a cross-sectional view showing a structure of a voltage regulator diode (semiconductor diode) as the semiconductor device according to the first embodiment of the present invention. The semiconductor diode 10a relating to the first embodiment of the present invention is formed with the first conductivity type first semiconductor region 14, the second conductivity type second semiconductor region 13, the first conductivity type third semiconductor region 15, the second conductivity type fourth semiconductor region 12 and the first conductivity type fifth semiconductor region 16 having impurity concentration lower than that of the first semiconductor region 14. The first conductivity type and the second conductivity type are conductivity types opposite to each other. Though FIG. 2A shows the case that the first conductivity type is assigned to be as n-type and the second conductivity type as p-type, the opposite can be acceptable. The first semiconductor region 14 encompasses a first end surface, a second end surface opposing to the first end surface and a first outer surface connecting the first end surface with the second end surface. The second semiconductor region 13 encompasses a third end surface, a fourth end surface opposing to the third end surface and a second outer surface connecting the third end surface with the fourth end surface. The fourth end surface is connected with the first end surface of the first semiconductor region 14. The third semiconductor region 15 is connected with the first semiconductor region 14 at the second end surface of the first semiconductor region 14. The fourth semiconductor region 12 is connected with the second semiconductor region 13 at the third end surface of the second semiconductor region 13. The fifth semiconductor region 16 encompasses an inner surface connected with the first outer surface of the first semiconductor region 14 and the second outer surface of the second semiconductor region 13, which is positioned between the third semiconductor region 15 and the fourth semiconductor region 12.

That is, the p-type fourth semiconductor region 12, the p-type second semiconductor region 13, the n-type first semiconductor region 14 and the n-type third semiconductor region 15 are stacked sequentially from the second main surface 11A side of a first conductivity type (n-type) silicon substrate 11 to the first main surface 11B. And the n-type fifth semiconductor region 16 is formed so that it surrounds the p-type second semiconductor region 13 and the n-type first semiconductor region 14. The n-type fifth semiconductor region 16 is formed to be connected with the p-type fourth semiconductor region 12 formed along the second main surface 11A and with the n-type third semiconductor region 15 formed along the first main surface 11B. Additionally, the first main electrode layer 18 and the second main electrode layer 17 made of a metal thin film respectively are deposited on the main surfaces 11A and 11B of the silicon substrate 11.

In FIG. 2A, the p-type fourth semiconductor region 12 is formed at the whole surface so that it has a region with a fixed depth from the second main surface 11A of the silicon substrate 11. The p-type fourth semiconductor region 12 is doped with accepter impurities such as, e.g. boron (B).

The p-type second semiconductor region 13 having high impurity concentration is connected with a center portion of interface between the p-type fourth semiconductor region 12 inside the silicon substrate 11. The p-type second semiconductor region 13 is formed by diffusing selectively accepter impurities from the second main surface 11A of the silicon substrate 11 prior to the p-type fourth semiconductor region 12.

The buried n-type first semiconductor region 14 is connected with the p-type second semiconductor region 13. The n-type first semiconductor region 14 is doped with donor impurities such as phosphorus (P) and arsenic (As) so as to achieve the high impurity concentration. The p-type second semiconductor region 13 is formed so that it swells toward the first main surface 11B of the silicon substrate 11. Accordingly, the pn junction interface where the p-type second semiconductor region 13 contacts with the n-type first semiconductor region 14 forms a curved surface.

The n-type third semiconductor region 15 is doped with donor impurities so as to obtain a high impurity concentration (e.g. $2 \times 10^{19}/cm^3$), the donor impurities are introduced from the whole first main surface 11B of the silicon substrate 11.

Consequently, the bottom perimeter of the p-type second semiconductor region 13 and the top of the n-type first semiconductor region 14 mate each other at deep inside of the silicon substrate 11 and at the plane center position of the semiconductor diode 10a. The second semiconductor region 13 and the first semiconductor region 14 join at a deep region disposed between the p-type fourth semiconductor region 12 formed at the whole second main surface 11A of the silicon substrate 11 and the n-type third semiconductor region 15 formed at the whole first main surface 11B. The n-type fifth semiconductor region 16 having relatively low impurity concentration inherent to the silicon substrate 11 is formed around the p-type second semiconductor region 13 and the n-type first semiconductor region 14 so that it surrounds the p-type second semiconductor region 13 and the n-type first semiconductor region 14. Accordingly, the n-type first semiconductor region 14 is formed so as to achieve the impurity concentration higher than that of the n-type fifth semiconductor region 16.

The semiconductor diode 10a is formed in such a way that a chip outer-surface 20 is almost perpendicular to both main surfaces of the silicon substrate 11 so as to implement a rectangular parallelepiped shape. An end portion of the flat second pn junction interface 19A between the p-type fourth semiconductor region 12A with the n-type fifth semiconductor region 16 having relatively low impurity concentration emerges at the chip outer-surface 20.

In the semiconductor diode 10a of the first embodiment, the p-type fourth semiconductor region 12 has homogeneous impurity concentration in a horizontal direction. The n-type first semiconductor region 14 having high impurity concentration is connected with the p-type second semiconductor region 13 swelled from a center portion of the p-type fourth semiconductor region 12. Therefore, if the way of breakdown procedures including the curved first pn junction interface 19 and the flat second pn junction interface 19A is observed, when a reverse bias voltage is applied between the first main electrode layer 18 and the second main electrode layer 17, the first pn junction interface (inside region) 19 of the p-type second semiconductor region 13 with the n-type first semiconductor region 14 is found to incur breakdown earlier to the second pn junction interface (peripheral region) 19A of the p-type fourth semiconductor region 12 with the n-type fifth semiconductor region 16. This is because the breakdown originates at the highest electric field portion, where the pn junction has higher impurity concentration for the n-type semiconductor regions. That is, in the first embodiment, even if there is a part where the second pn junction interface emerges outside, breakdown at the pn junction interface occurs in the first pn junction interface 19 of the inside region and there is no bearing of surface field intensity acted on the pn junction interface between the part emerging outside.

The semiconductor diode 10a of the first embodiment can improve its breakdown voltage more than the device structure in which the n-type first semiconductor region 14 connects directly with the n-type semiconductor region 12, since the first pn junction interface 19 between the p-type second semiconductor region 13 with the n-type first semiconductor region 14 is formed in a deeper region of the silicon substrate 11.

The semiconductor diode 10a of the first embodiment can reduce surface treatment such as wet cleaning by acid or alkali chemicals and coating treatment by insulation films with the object of protecting the chip outer-surface 20 from outside environment. Since the chip outer-surface 20 can allow occurrence of a slight change in surface state and surface failures, the handling of the chip will be easier.

In the semiconductor diode 10a of the first embodiment, the breakdown voltage of the pn junction between the first semiconductor region 14 in the center and the p-type second semiconductor region 13 is determined by impurity concentration $N_B$ of the n-type first semiconductor region 14. If the first pn junction interface 19 between the p-type second semiconductor region 13 with the n-type first semiconductor 14 formed a one-sided abrupt junction, the breakdown voltage $V_B$ by an avalanche breakdown could be obtained by;

$$V_B = \in_S E_m^2/(2qN_B). \quad (1)$$

Here, $\in_S$ is a dielectric constant, $E_m$ is a maximum field intensity inherent to the semiconductor substrate at which breakdown begins, q is the elementary charge of electron and $N_B$ is impurity concentration of the first semiconductor region 14. That is, if the impurity concentration $N_B$ of the first semiconductor region 14 is much higher than that of a silicon wafer, i.e. that of the fifth semiconductor region 16, the breakdown voltage of the semiconductor diode 10a depends only on the impurity concentration $N_B$ of the first semiconductor region 14 and not on the impurity concentration of the base material (silicon wafer) 16 to be originally prepared for manufacturing. Therefore, if the impurity concentration $N_B$ of the first semiconductor region 14 is designed according to the Eq. (1) for controlling the impurity concentration $N_B$, a desired breakdown voltage can be obtained and there is no need to control the resistivity ρ of the silicon wafer 16 with high accuracy. Accordingly, if we prepare a substrate having resistivity relatively higher than the resistivity of the semiconductor region 14, corresponding to the speculated impurity concentration $N_B$ for the semiconductor region 14 by Eq. (1), we can use an arbitrary commercial silicon wafer so as to manufacture the voltage regulator diode 10 having the desired breakdown voltage. In the first embodiment, for silicon wafer, one with a wide range of resistivity as 1 to 250 Ω·cm (this corresponds to a range of $5.5\times10^{15}/cm^3$ to $1.8\times10^{13}/cm^3$ in impurity concentration for the n-type silicon) can be used for manufacturing. Furthermore, for a power semiconductor device with higher breakdown voltage, one with a wide range of resistivity ρ of higher than 1000 Ω·cm (this corresponds to a range of lower than $5\times10^{12}/cm^3$ in impurity concentration) can be used.

For the semiconductor diode 10a of the first embodiment, since the chip outer-surface 20 of the rectangular parallelepiped chip cut from the silicon wafer is almost perpendicular to both main surfaces of the silicon substrate 11, the chip can be easily handled as represented by easy mounting on a jig such as a collet during an assembling process.

Figure 2B:
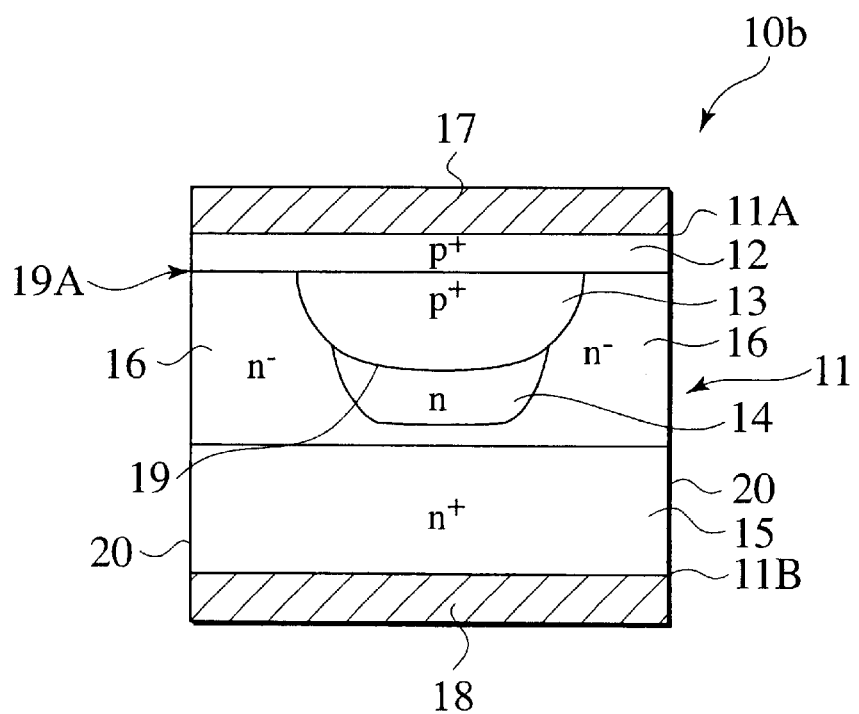
FIG. 2B is a cross-sectional view showing a semiconductor device according to a modification of the first embodiment of the present invention.

FIG. 2B is a cross-sectional view showing a structure of the voltage regulator diode (semiconductor diode) 10b as a semiconductor device of a modification of the first embodiment of the present invention. The semiconductor diode 10b of the modification of the first embodiment of the present invention is the voltage regulator diode with breakdown voltage higher than the one in FIG. 2A and has a thin-layered n-type fifth semiconductor region 16 having impurity concentration lower than that of the first semiconductor region 14 sandwiched between the n-type first semiconductor region 14 and the n-type third semiconductor region 15. As a thin layer of the n-type fifth semiconductor region 16 with low impurity concentration is sandwiched, it has a higher breakdown voltage than the one in FIG. 2A. Since other explanations are the same as for the semiconductor device 10a of the first embodiment shown in FIG. 2A, repetition is omitted.

A manufacturing method for the semiconductor diode 10a of the first embodiment is explained by using a sequence of process cross-sectional views shown in FIGS. 3A to 3K.

Figure 3A:
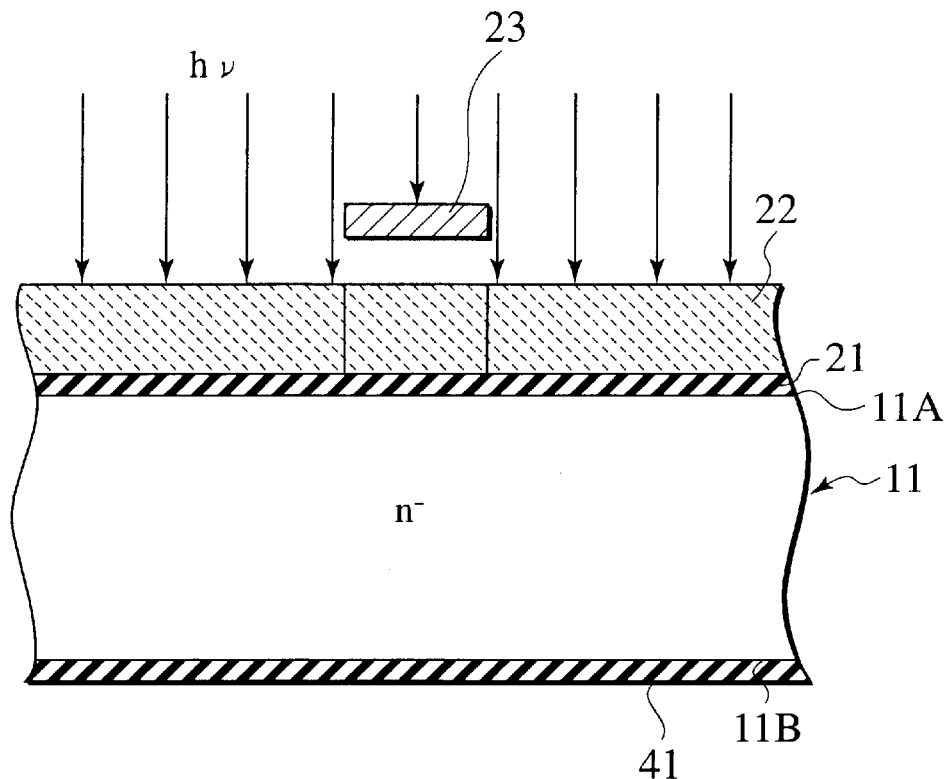
FIGS. 3A to 3K are process cross-sectional views showing a manufacturing method of the semiconductor device according to the first embodiment of the present invention.

(a) As shown in FIG. 3A, a first conductivity type (n-type) silicon substrate (silicon wafer) 11 having the first main surface 11B and the second main surface 11A is prepared. Thermal oxidization is performed on the first main surface 11B and the second main surface 11A of the silicon substrate 11 to form silicon oxide films 41 and 21 with thickness of 300 nm to 1.5 μm respectively. Then, using photolithographic techniques, the silicon oxide film 21 on the second main surface 11A is delineated. For example, as shown in FIG. 3A, a negative type photoresist 22 is coated on the silicon oxide film 21 by spin coating. Then as shown in FIG. 3A, a photomask having an opaque pattern 23, which corresponds to the pattern for the n-type first semiconductor region 14 and covers a part where an opening 22A described below will be cut in the photoresist 22, is aligned to be irradiated by exposure light h v. Although a single opaque pattern 23 is disclosed in FIG. 3A, there are many opaque patterns periodically arranged in a matrix form to manufacture many semiconductor diodes 10a on a single silicon wafer 11, in reality.

Figure 3B:
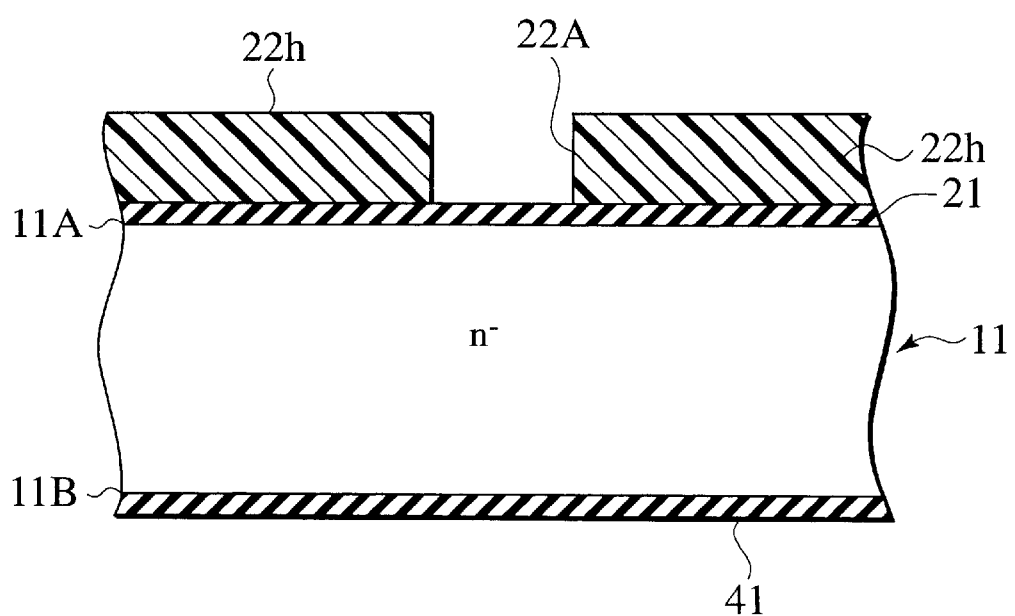
Figure 3C:
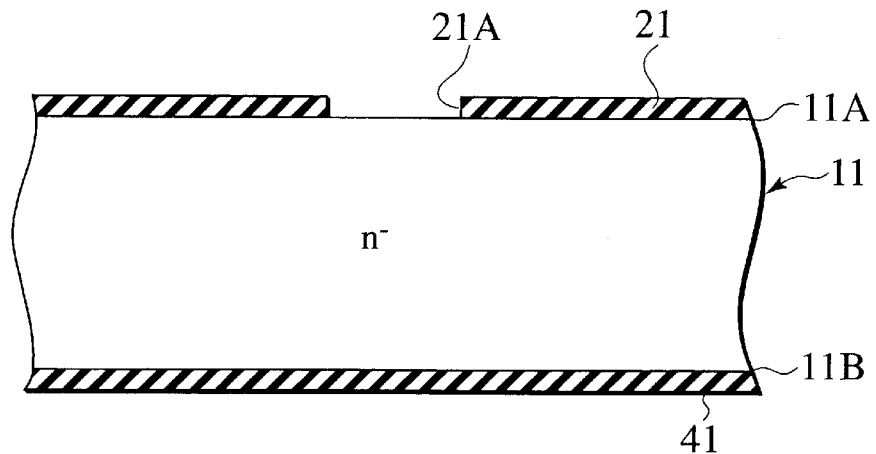

(b) FIG. 3B shows a state having the photoresist 22h developed after the exposure. The photoresist 22h patterned in such a way is used as an etching mask for wet etching or dry etching to selectively remove the silicon oxide film 21, emerging at the bottom of the opening 22A in the photoresist 22h a part of the top surface of the silicon substrate 11. In this case, another photoresist (figure is omitted) is also coated on the silicon oxide film 41 on the first main surface 11B side for protecting the silicon oxide film 41. Then peeling off the photoresist 22h gives a state shown in FIG. 3C. As shown in FIG. 3C, an opening 21A is cut in the silicon oxide film 21 to expose a part of the second main surface 11A. Although a single opening 21A is disclosed in FIG. 3A, there are many openings 21A periodically arranged in a matrix form to manufacture many semiconductor diodes 10a on the silicon wafer 11, in reality.

Figure 3D:
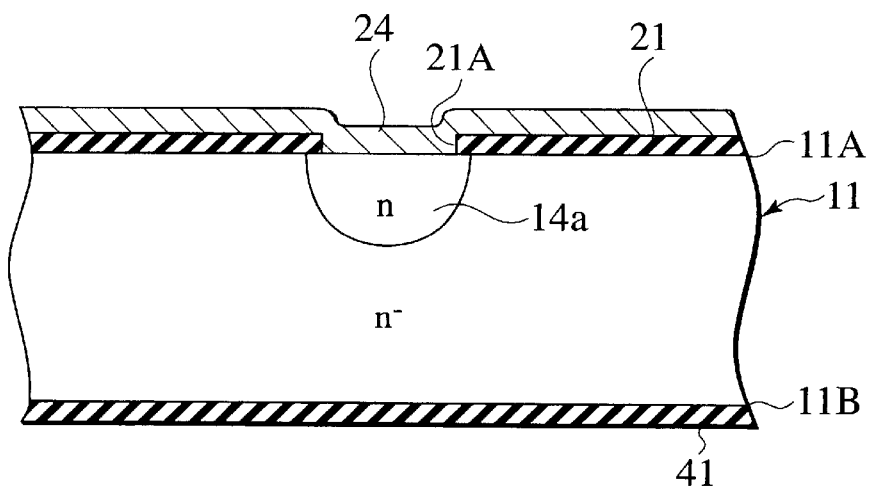

(c) A heavily-impurity-doped thin film 24 such as a phosphorus glass (PSG) film and an arsenic glass (AsSG) film is blanket deposited so as to include the part of the top surface of silicon substrate 11, exposed at the opening 21A in the silicon oxide film 21. The PSG film contains the n-type dopant, or phosphorus (P), and the AsSG film contains arsenic (As). Then, a heat treatment is performed at a predetermined diffusion temperature and for a predetermined diffusion time so as to selectively diffuse the n-type dopant, forming the n-type first semiconductor region 14a having high impurity concentration as shown in FIG. 3D. Although a single first semiconductor region 14a is disclosed in FIG. 3D, there are many first semiconductor regions 14a periodically arranged in a matrix form to manufacture many semiconductor diodes 10a on the silicon wafer 11. Then the impurity-doped thin film 24 is removed. Since a diffusion depth of the first semiconductor region 14a will finally be deep enough to be about half of thickness of the silicon substrate 11, it is preferable to use phosphorus (P), which has high diffusion coefficient, as an n-type impurity elements. Particularly, it is preferable to select an n-type impurity elements having higher diffusion coefficient than that of p-type impurity at the time of forming the p-type second semiconductor region 13 as described below. Gaseous phase diffusion method using a liquid source such as phosphoryl chloride (POCl$_3$) without using the impurity-doped thin film can be also acceptable. And it is also acceptable to implant impurity ions such as $^{31}P^+$ by a predetermined dose such as $3\times10^{15}$ cm$^{-2}$ to $5\times10^{16}$ cm$^{-2}$, and then to drive-in (heat-treat) them to a desired depth. $^{75}As^+$ can be implanted, however it is not preferable because arsenic (As) has a low diffusion coefficient and needs higher diffusion temperature and longer diffusion time. When the impurity-doped thin film 24 is used, the impurity-doped thin film 24 is afterward wet-etched or dry-etched for removing. Even when the impurity-doped thin film 24 is not used, PSG film formed inside the diffusion window at the time of driving-in is wet etched or dry etched for removing.

Figure 3E:
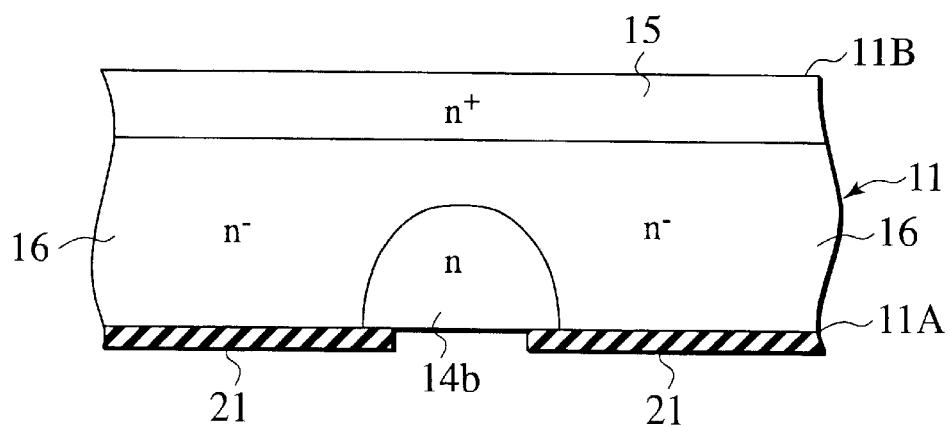

(d) Next, the second main surface 11A of the silicon substrate 11 is coated with the photoresist (figure is omitted) to remove the silicon oxide film 41 on the first main surface 11B of the silicon substrate. Then as shown in FIG. 3E, donor impurities such as phosphorus (P) and arsenic (As) are diffused over the whole of the first main surface 11B of the silicon substrate 11 to form the n-type third semiconductor region 15 having high impurity concentration (e.g. about $2\times10^{19}/cm^3$). At this time, the shallow n-type first semiconductor region 14a in FIG. 3D is pushed deeper to become the deeper n-type first semiconductor region 14b. A region around the n-type first semiconductor region 14b is the n-type fifth semiconductor region 16 retaining impurity concentration inherent to the silicon substrate 11. Gaseous phase diffusion method using a liquid source such as POCl$_3$ without using the impurity-doped thin film is also acceptable. And it is also acceptable to implant impurity ions such as $^{31}P^+$, $^{75}As^+$ by a predetermined dose such as $3\times10^{15}$ cm$^{-2}$ to $5\times10^{16}$ cm$^{-2}$ and then to drive-in (heat-treat) it to a desired diffusion depth. A layer thickness made of the silicon substrate sandwiched between the first semiconductor region 14b and the third semiconductor region 15 is preferably set to be such a thickness that the layer is pushed at the specific time in the process sequence (refer to FIG. 3I), forming the p-type fourth semiconductor region 12 at the whole second main surface 11A as described below, and the first semiconductor region 14 is finally and completely connected with the third semiconductor region 15. As shown in FIG. 3E, PSG film formed inside diffusion windows of the first main surface 11B and the second main surface 11A of the silicon substrate 11 at the time of driving-in is wet etched or dry etched for removing.

Figure 3F:
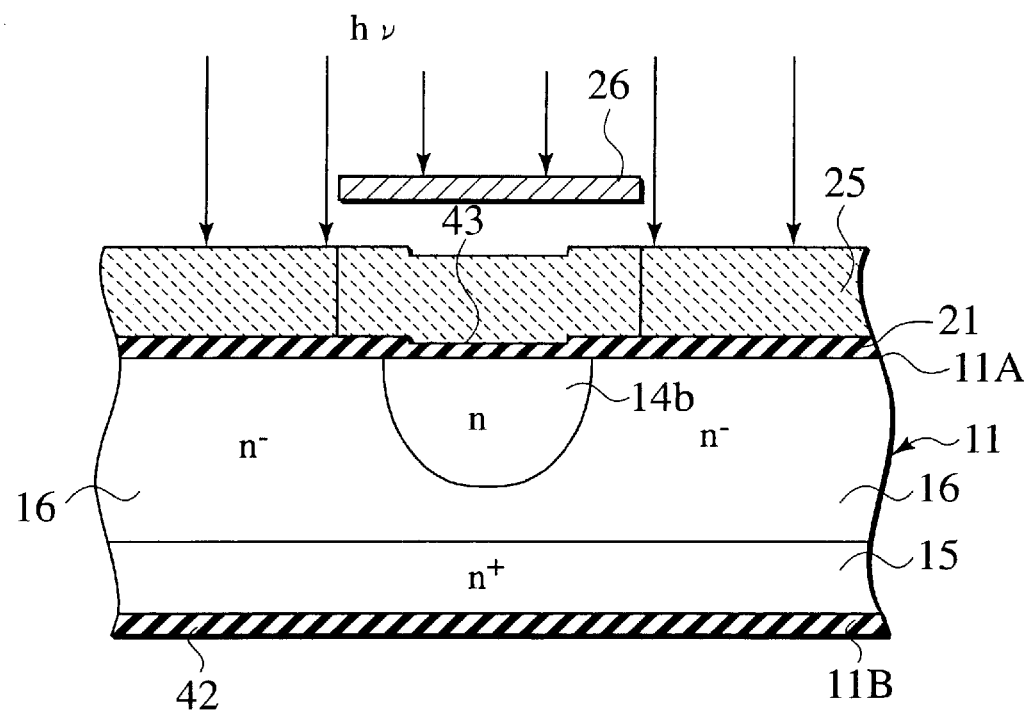

(e) Next, the first main surface 11B of the silicon substrate 11 is thermal-oxidized to form a new silicon oxide film 42 with thickness of 300 nm to 1.5 μm. At this time, inside the diffusion window used for the first semiconductor region 14 of the second main surface 11A of the silicon substrate 11, a new silicon oxide film 43 with thickness of 300 nm to 1.5 μm is also formed. The silicon oxide film 21 grown on the second main surface 11A of the silicon substrate 11 increases its film thickness slightly. And as shown in FIG. 3F, e.g. a negative-type photoresist 25 is, e.g. spin-coated for coating on the second main surface 11A side of the silicon substrate. Then the photomask 26 having patterns for forming the p-type second semiconductor region 13 is aligned appropriately above the photoresist 25 to be irradiated by exposure light. One with area larger than the opaque pattern of the photomask 23 shown in FIG. 3A is used for the opaque pattern designed for non-exposure part in the photomask 26.

Figure 3G:
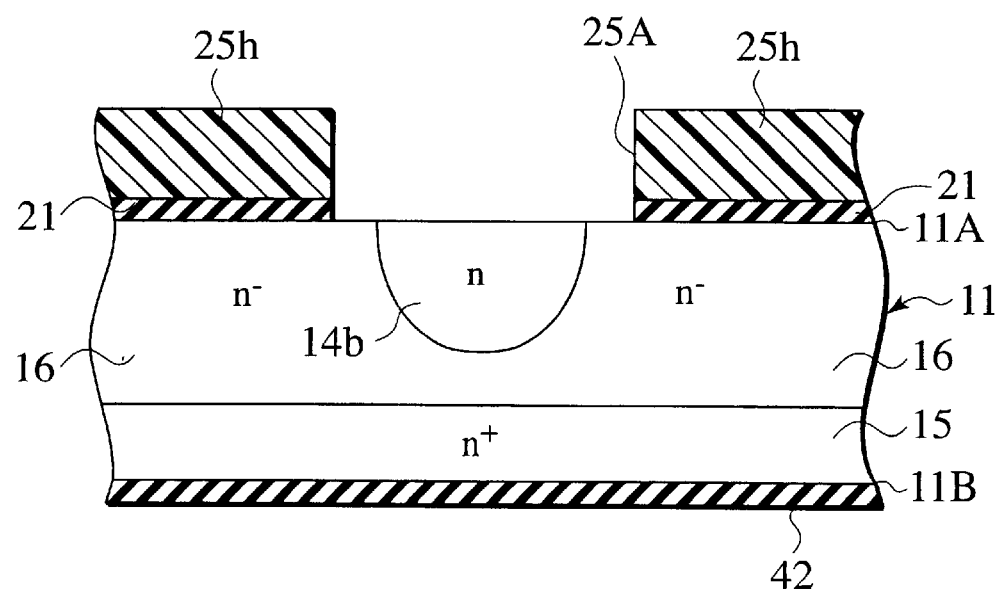

(f) Then after developing the photoresist 25 exposed in such a way, a part of the silicon oxide film 21, exposed at the bottom of the opening 25A in the photoresist 25, is selectively wet etched or selectively dry etched, and the geometry shown in FIG. 3G is achieved. In this case, the photoresist (figure is omitted) is also coated on the silicon oxide film 42 on the first main surface 11B side for protecting the silicon oxide film 42.

Figure 3H:
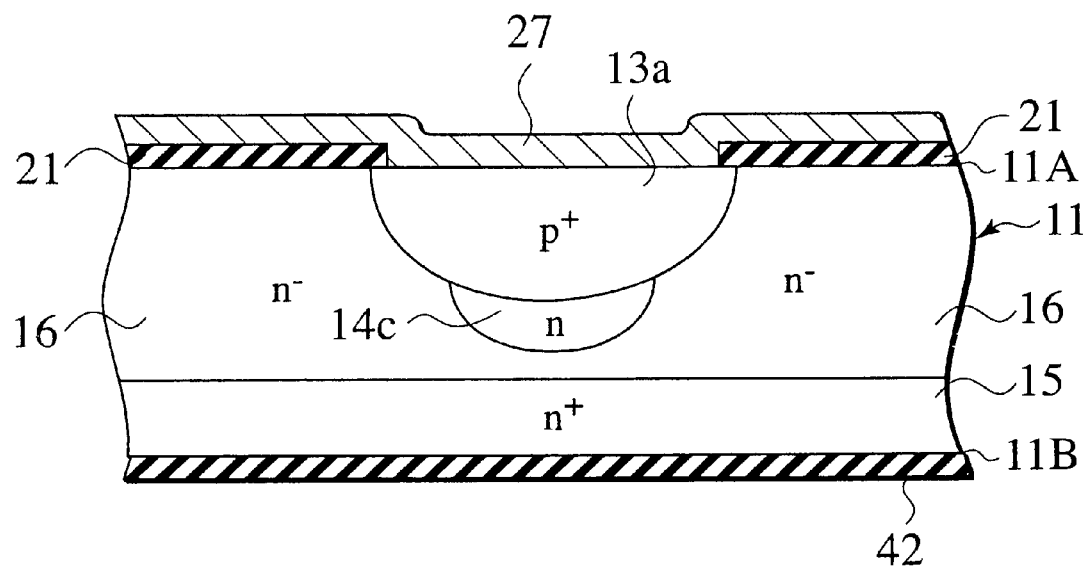

(g) After that, the photoresist 25 is peeled off to deposit an impurity-doped thin film 27, such as a heavily doped boron glass (BSG) film including dopant of boron (B), as accepter impurity. Heat treatment at a predetermined diffusion temperature and for a predetermined diffusion time is performed for diffusing selectively the accepter impurity to form the p-type second semiconductor region 13a having high impurity concentration from the second main surface 11A side of the silicon substrate exposing as shown in FIG. 3H. By driving-in (heat-treating) for forming the p-type second semiconductor region 13a, the n-type first semiconductor region 14b shown in FIG. 3G is further pushed inside and becomes the still deeper first semiconductor region 14c. At this stage, a thin layer made of the silicon substrate 11 may intervene between the first semiconductor region 14c and the third semiconductor region 15. Layer thickness made from the silicon substrate 11 sandwiched between tips of the first semiconductor region 14c and third semiconductor region 1 can be acceptable if the layer is pushed inside at the time of process to form the p-type fourth semiconductor region 12 along the whole surface (refer to FIG. 3I) and the first semiconductor region 14 is finally and completely connected with the third semiconductor region 15. Then the impurity-doped thin film 27 and the silicon oxide film 21 on the second main surface 11A are removed by wet etching or dry etching. In case of wet etching, it is naturally necessary that the photoresist (figure is omitted) is also coated on the silicon oxide film 42 on the first main surface 11B side to protect the silicon oxide film 42.

Figure 3I:
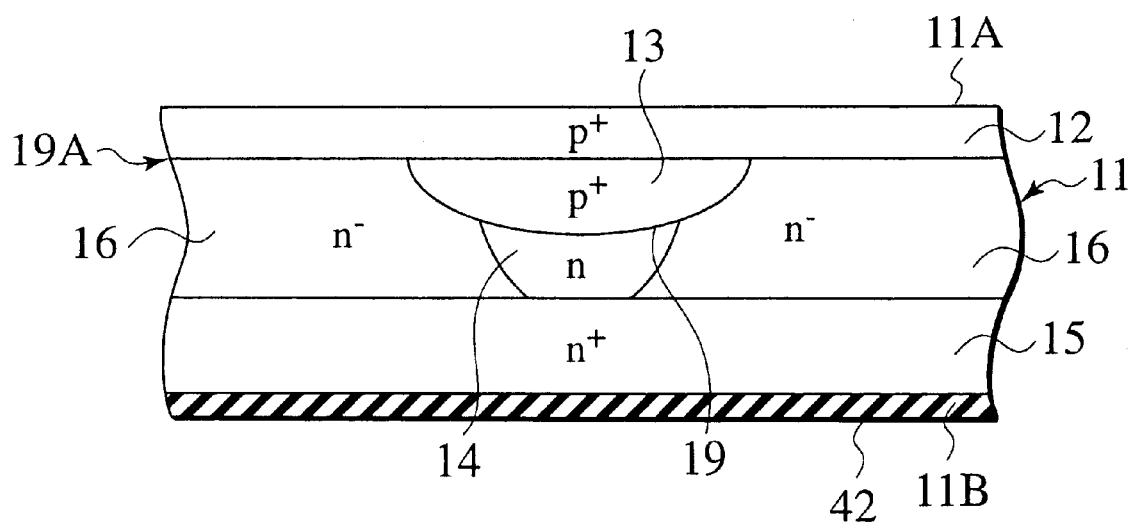

(h) Next, as shown in FIG. 3I, accepter impurity, e.g. boron (B), is blanket diffused along the whole surface from the second main surface 11A side of the silicon substrate 11 to form the flat p-type fourth semiconductor region 12. By driving-in (heat-treating) for forming the flat p-type fourth semiconductor region 12, tips of the p-type second semiconductor region 13a and the first semiconductor region 14c shown in FIG. 3H are still further pushed inside to become the p-type second semiconductor region 13 and the first semiconductor region 14. As a result, as shown in FIG. 3I, the first semiconductor region 14 is completely connected with the third semiconductor region 15. For the blanket diffusion of accepter impurity to form the flat p-type fourth semiconductor region 12, a method to use the impurity-doped thin film such as boron glass (BSG) or the gaseous phase diffusion method to use a solid source such as boron nitride (BN) or a liquid source such as boron tribromide (BBr$_3$) will be acceptable. And it is also acceptable to implant impurity ions such as $^{11}B^+$, $^{49}BF_2^+$ with a predetermined dose such as $3\times10^{15}$ cm$^{-2}$ to $5\times10^{16}$ cm$^{-2}$ and then to drive-in (heat-treat) them to a desired diffusion depth. As a result, as shown in FIG. 3I, the p-type second semiconductor region 13 and the n-type first semiconductor region 14 are sandwiched between the p-type fourth semiconductor region 12 formed at the whole second main surface 11A side of the silicon substrate 11 and the n-type third semiconductor region 15 formed at the whole first main surface 11B side. The n-type fifth semiconductor region 16 having impurity concentration inherent to the silicon substrate 11 is formed around the p-type second semiconductor region 13 and the n-type first semiconductor region 14 so that it surrounds the p-type second semiconductor region 13 and the n-type first semiconductor region 14. The n-type first semiconductor region 14 is formed so as to achieve the impurity concentration higher than that of the n-type fifth semiconductor region 16. And the n-type first semiconductor region 14 forms the first pn junction interface 19 with a curved surface connected with the p-type second semiconductor region 13 swelled from a center portion of the p-type fourth semiconductor region 12. Furthermore, the p-type fourth semiconductor region 12 and the n-type fifth semiconductor region 16 with relatively low impurity concentration are connected with each other to form the second pn junction interface.

Figure 3J:
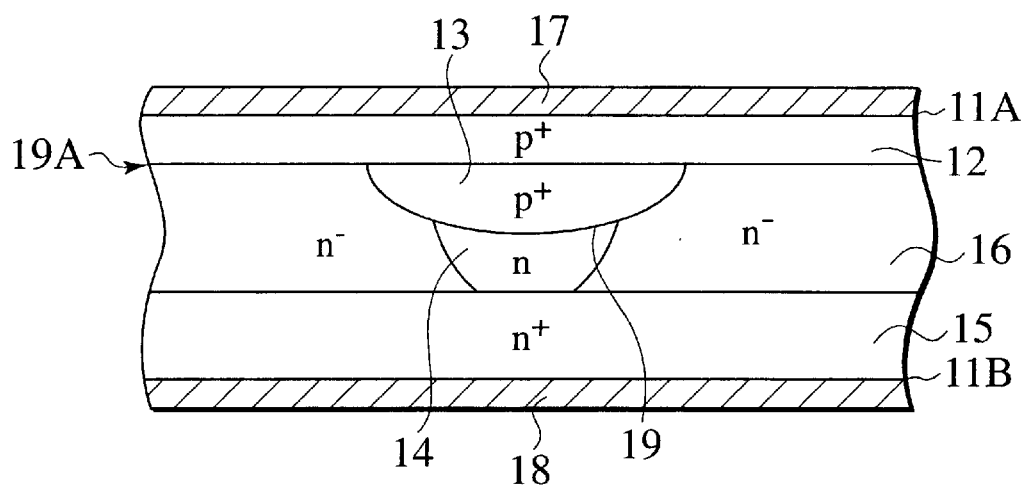

(i) And then, as shown in FIG. 3J, metal thin films are deposited on surfaces of the p-type semiconductor layer 12 and the n-type semiconductor layer 15 by a vacuum evaporation method or a spattering method to form the first main electrode layer 18 and the second main electrode layer 17 with a thickness of 1 μm to 10 μm.

Figure 3K:
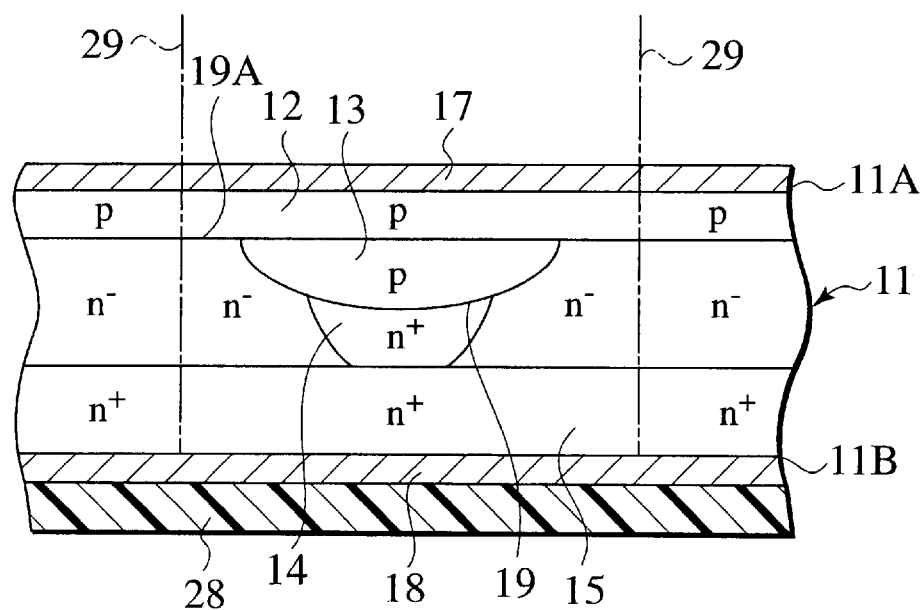

(j) Finally as shown in FIG. 3K, a synthetic resin sheet 28 is stuck over the whole of e.g. the first main surface 11B (outside the electrode 18) of the silicon substrate 11 to be cut along dicing lines 29 marked with a dashed line as shown in FIG. 3K. Although only two dicing lines 29 are shown in FIG. 3K, there are many dicing lines 29 prescribed in a matrix form. Namely, although a single semiconductor diode is disclosed in FIG. 3K, many semiconductor diodes periodically arranged in a matrix form are manufactured simultaneously on the silicon wafer 11, in reality. For the synthetic resin sheet 28, a polyethylene film, a polypropylene film, a polyvinyl chloride film, a polyethylene terephthalate film, a polybutylene terephthalate film, a polybutene film, a polybutadiene film, a polyurethane film, a polymethyl pentene film, an ethylene-vinyl acetate copolymer film, an ethylene-(met) acrylic acid copolymer film, an ethylene-(met) acrylic acid methyl copolymer film and an ethylene-(met) acrylic acid ethyl copolymer film can actually be used. The synthetic resin sheet 28 can be a laminated film of these films. Film thickness of the synthetic resin sheet 28 is usually 10 to 300 $\mu$m, preferably 50 to 200 $\mu$m. The plane cut along the dicing line 29 in this way will become the chip outer-surface 20 as described above. The chips, each formed into the rectangular parallelepiped shape by the cutting process, can respectively be used for the semiconductor diodes 10a shown in FIG. 2A. After the cutting process, a plurality of the semiconductor diodes 10a in the rectangular parallelepiped geometry, or the chip state can be stored and carried in a state of being stuck to the synthetic resin sheet 28. Therefore, at the time of packaging process, or the assembling process so as to yield the product, the plurality of semiconductor diodes 10a stuck to the synthetic resin sheet 28 can be handled easily e.g. when they are mounted respectively on a jig such as a collet.

According to the manufacturing method of the semiconductor device of the first embodiment, the chip outer-surface 20 of the rectangular parallelepiped semiconductor diode 10a is formed in almost perpendicular to both main surfaces of the silicon substrate 11, as cut by the dicing process. Therefore, several machining processes to form the bevel contour are not needed as in the past and the number of production steps can be greatly reduced.

(Second Embodiment)

Figure 4:
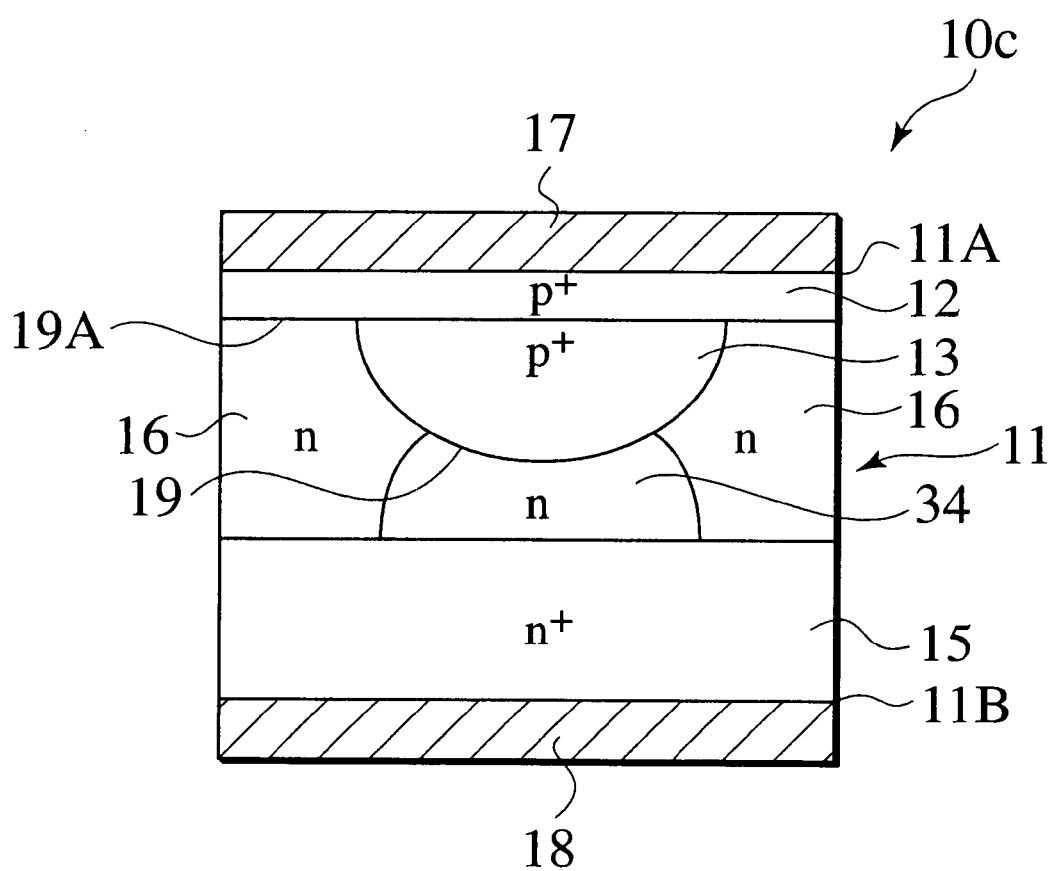
FIG. 4 is a cross-sectional view showing a semiconductor device according to the second embodiment of the present invention.

Here the semiconductor diode 10c relating to the second embodiment of the present invention is explained by using FIG. 4. For manufacturing the semiconductor diode shown in FIG. 4, the n-type first semiconductor region 34 is diffused selectively from the first main surface 11B side of the silicon substrate 11, opposite diffusion direction to the first embodiment. Remember that the n-type first semiconductor region 14 has a curved surface protruding downward as shown in FIG. 2A. On the contrary, as shown in FIG. 4, the n-type first semiconductor region 34 has a curved surface protruding upward. The p-type second semiconductor region 13 has a curved surface protruding downward as shown in FIG. 4, which has the same topology as FIG. 2A.

That is, the p-type fourth semiconductor region 12 and the second semiconductor region 13 are diffused to be formed from the second main surface 11A of the silicon substrate 11 and the n-type third semiconductor region 15 and the first semiconductor region 34 are diffused to be formed from the first main surface 11B of the silicon substrate 11. Accordingly, in the second embodiment, there will be no problem such as the compensation of the n-type and the p-type impurity elements. Therefore there is an advantage that the n-type impurity concentration and the p-type impurity concentration of each semiconductor region 34, 13 are easily controlled compared to the semiconductor diodes 10a and 10b of the first embodiment. Since others have essentially the same structure as the semiconductor diode 10a used in the first embodiment and function approximately the same way, repeating explanations is avoided.

Next, a manufacturing method for the semiconductor diode 10c of the second embodiment is explained by using a sequence of process cross-sectional views shown in FIGS. 5A to 5E.

Figure 5A:
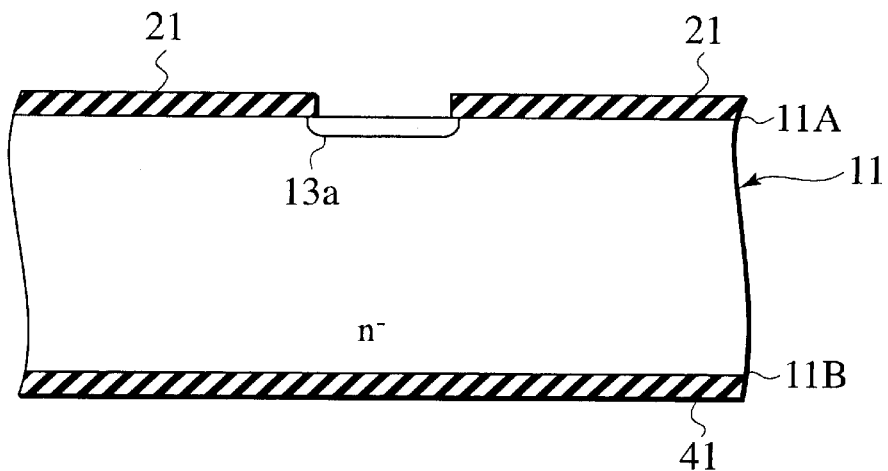
FIGS. 5A to 5E are process cross-sectional views showing a manufacturing method of the semiconductor device according to the second embodiment of the present invention.

(a) First, the first conductive (n-type) silicon substrate (silicon wafer) 11 is prepared. The main surface 11B and the second main surface 11A of the silicon substrate are thermal-oxidized to form silicon oxide films 41 and 21 with a thickness of 300 nm to 1.5 $\mu$m respectively. Then a diffusion window is formed in the silicon oxide film 21 on the second main surface 11A by using photolithographic techniques and etching techniques. After pre-deposition method of boron (B) atoms as the p-type impurity elements, the boron (B) atoms are introduced selectively by using the diffusion window. BSG film formed inside the diffusion window of the second main surface 11A of the silicon substrate 11 at the time pre-deposition method is removed by using wet etching. The p-type impurity elements just after being introduced by the pre-deposition method form a very shallow second semiconductor region 13a with 1 $\mu$m or less as shown in FIG. 5A.

Figure 5B:
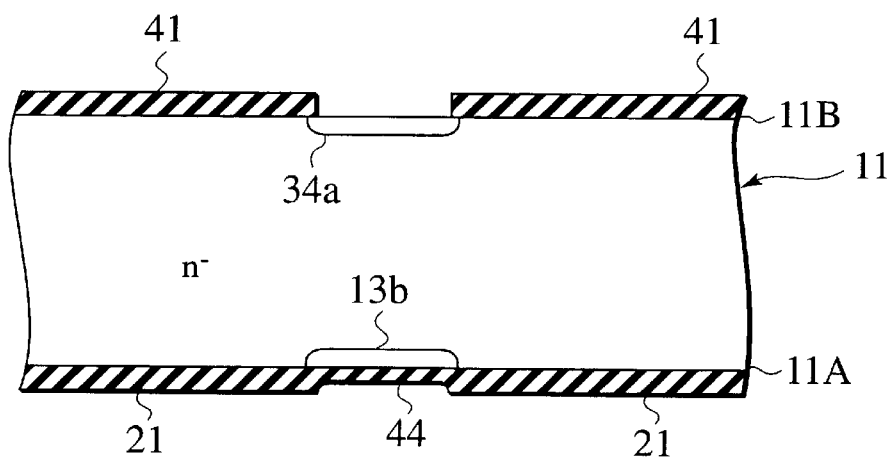
Figure 5C:
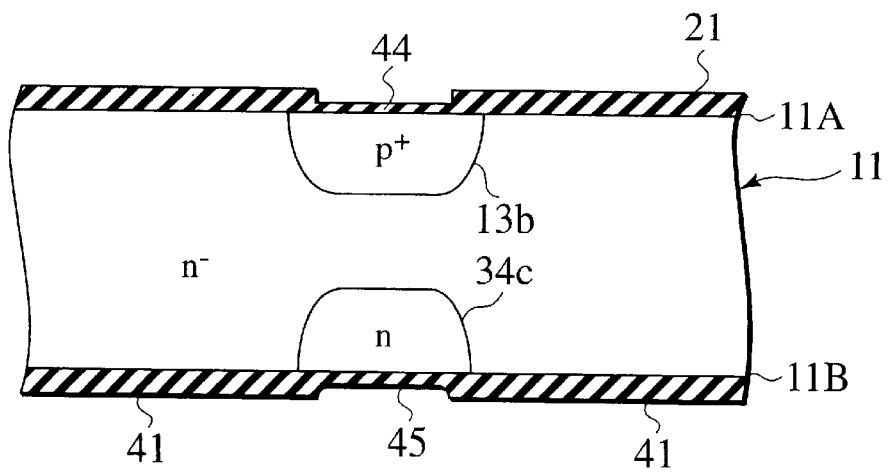

(b) The silicon substrate 11 is thermal-oxidized for forming the silicon oxide film 44 with a thickness of 300 $\mu$ to 500 nm at the second main surface 11A exposed inside the diffusion window of the second main surface 11A, covering the exposed portion of the second main surface 11A with the silicon oxide films 21 and 44. A diffusion window is formed in the silicon oxide film 41 on the first main surface 11B by using photolithographic techniques and etching techniques. Then by using the diffusion window, phosphorous (P) atoms as the n-type impurity elements are introduced selectively by pre-deposition method to form the first semiconductor region 34a as shown in FIG. 5B. FIG. 5B shows a state that the PSG film formed inside the diffusion window of the first main surface 11B of the silicon substrate 11 at the time of pre-deposition method is removed by using wet etching. By heat treatment at the time of pre-deposition method of the n-type impurity elements, the second semiconductor region 13a is pushed slightly deeper than the one shown in FIG. 5A to become the slightly deeper second semiconductor region 13b as shown in FIG. 5B. Furthermore, by the driven-in treatment (thermal treatment) at a predetermined diffusion temperature in an oxidizing ambient, the first semiconductor region 34c and the second semiconductor region 13b are formed as shown in FIG. 5C. By driving-in treatment in the oxidizing ambient, a new silicon oxide film 45 is formed also at the first main surface 11B of the silicon substrate 11 exposed in the diffusion window. At this time, a layer made of the silicon substrate 11 intervenes between the first semiconductor region 34c and the second semiconductor region 13b.

Figure 5D:
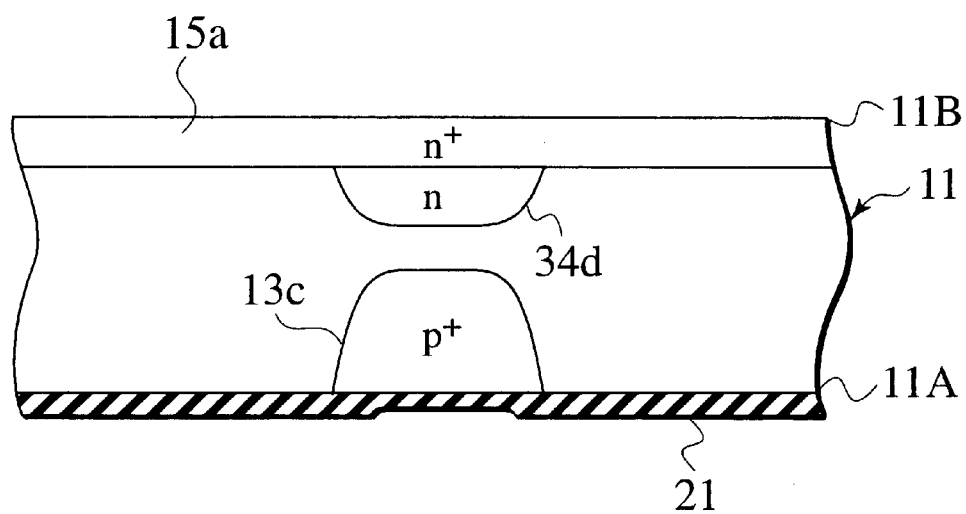

(c) Next, the silicon oxide film 41 on the first main surface 11B is removed totally. And, by blanket pre-deposition method, the n-type impurity elements are introduced in the first main surface 11B. Thereafter, the n-type impurity elements are additionally drive-in by heat-treating to form the fifth semiconductor region 15a along the whole surface as shown in FIG. 5D. FIG. 5D shows a state after the PSG film formed on the first main surface 11B of the silicon substrate 11 at the time of forming the fifth semiconductor region 15a is removed by using wet etching. At this time, the first semiconductor region 34c and the second semiconductor region 13c shown in FIG. 5C are further pushed deeper to become the deeper first semiconductor region 34d and the deeper second semiconductor region 13c. A layer made of the thin silicon substrate 11 still intervenes between the deeper first semiconductor region 34d and the deeper second semiconductor region 13c.

Figure 5E:
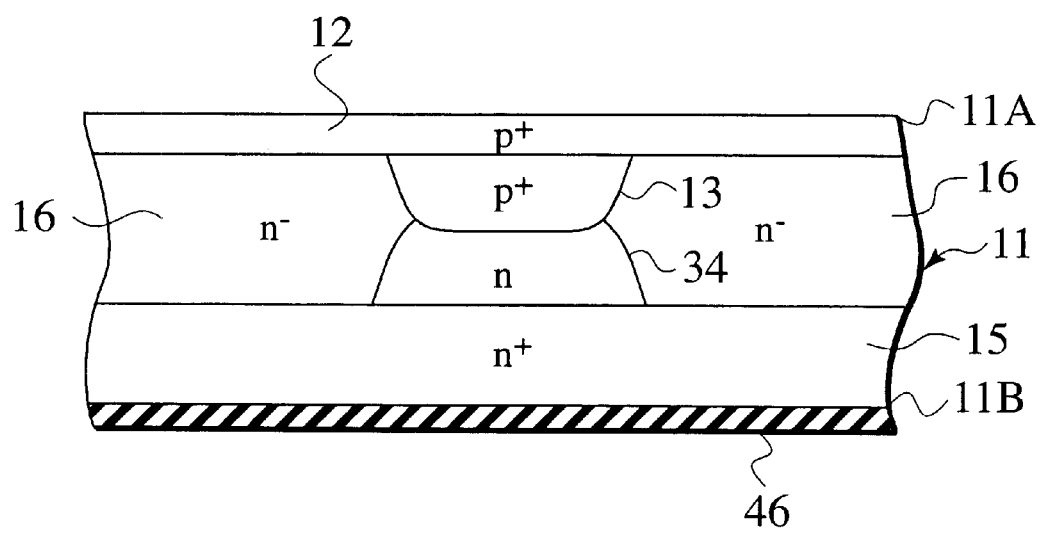

(d) After that, the silicon substrate 11 is further thermal-oxidized to form a new silicon oxide film 46 with a thickness of 300 nm to 500 nm on the first main surface 11B. Then the silicon oxide film 21 on the second main surface 11A is removed totally. Thereafter, by the blanket pre-deposition method, the p-type impurity elements are introduced in the second main surface 11A, and additionally heat-treated to form the fourth semiconductor region 12 along the whole surface as shown in FIG. 5E. FIG. 5E shows a state after the BSG film formed on the second main surface 11A of the silicon substrate 11 at the time of forming the fourth semiconductor region 12 is removed by using wet etching. At this time, the deeper first semiconductor region 34d and the deeper second semiconductor region 13c are further pushed deeper to each other and become the final first semiconductor region 34 and the final second semiconductor region 13 to form the pn junction for each other. As a result, the n-type fifth semiconductor region 16 having impurity concentration inherent to the silicon substrate 11 remains around the p-type second semiconductor region 13 and the n-type first semiconductor region 34 so that it surrounds the p-type second semiconductor region 13 and the n-type first semiconductor region 34.

Since the processes hereafter are the same as described in FIG. 3J and beyond in the first embodiment, further explanation is omitted.

In the manufacturing method for the semiconductor diode 10c of the second embodiment of the present invention, either the process for forming the first semiconductor region 34 or that for the second semiconductor region 13 can be elected to be performed in first of the process sequences. And whichever can be employed in first of the process sequences to form the third semiconductor region 15 or the fourth semiconductor region 12.

(Third Embodiment)

Figure 6:
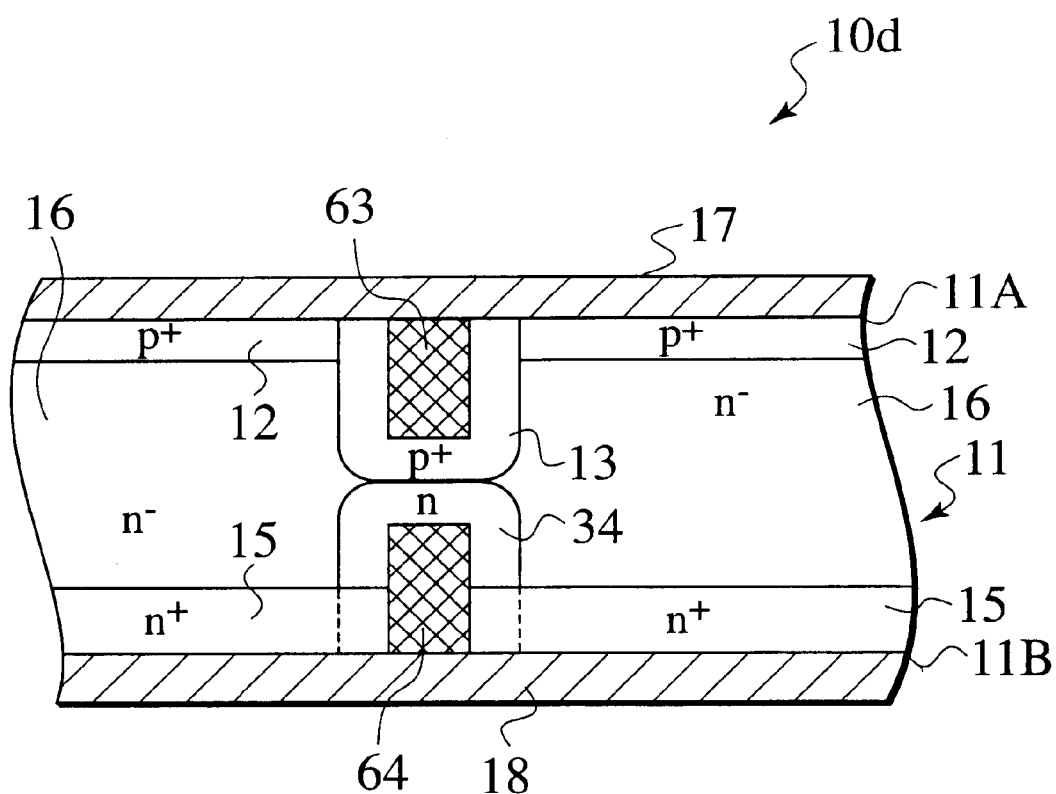
FIG. 6 is a cross-sectional view showing a semiconductor device according to the third embodiment of the present invention.

FIG. 6 is a cross-sectional view showing a structure of a voltage regulator diode (semiconductor diode) as a semiconductor device according to the third embodiment of the present invention. The semiconductor diode 10d of the third embodiment is formed with the first conductivity type (n-type) first semiconductor region 34, the second conductivity type (p-type) second semiconductor region 13, the first conductivity type (n-type) third semiconductor region 15, the second conductivity type (p-type) fourth semiconductor region 12 and the first conductivity type (n-type) fifth semiconductor region 16 having impurity concentration lower than that of the first semiconductor region 34. The second conductivity type is opposite to the first conductivity type, and it is acceptable that the first conductivity type is assigned to be the p-type and the second conductivity type is the n-type. As shown in FIG. 6, the first conductivity type region 34 encompasses a first end surface, a second end surface opposing to the first end surface and a first outer surface connecting the first end surface with the second end surface. The second semiconductor region 13 encompasses a third end surface, a fourth end surface opposing to the third end surface and a second outer surface connecting the third end surface with the fourth end surface. The fourth end surface is connected with the first end surface of the first semiconductor region 34. The third semiconductor region 15 is connected with the first semiconductor 34 at the second end surface of the first semiconductor region 34. The fourth semiconductor region 12 is connected with the second semiconductor region 13 at an upper part of the second outer surface near the third end surface. The fifth semiconductor region 16 encompasses an inner surface connected with the first outer surface of the first semiconductor region 34 and the second outer surface of the second semiconductor region 13, and also is positioned between the third semiconductor region 15 and the fourth semiconductor region 12. The fourth semiconductor region 12 of the second conductivity type may connect with the second semiconductor region 13 at the third end surface, if the impurity concentration of the fourth semiconductor region 12 is higher than the impurity concentration of the second semiconductor region 13, because the accepter impurity for the fourth semiconductor region 12 will occupy the upper part of the second semiconductor region 13 so as to shrink the area for the second semiconductor region 13.

A recessed portion (U groove) is formed in the n-type first semiconductor region 34 to bury a first main electrode plug 64 with electric conductivity higher than the first semiconductor region 34 inside the recessed portion so that the plug 64 makes ohmic contact with the first semiconductor region 34. A recessed portion (U groove) is also formed in the p-type second semiconductor region 13 to bury a second main electrode plug 63 with electric conductivity higher than the second semiconductor region 13 inside the recessed portion so that the plug 63 makes ohmic contact with the second semiconductor region 13. The first main electrode plug 64 and the second main electrode plug 63 are made of materials with high electric conductivity made of refractory metals such as tungsten (W), titanium (Ti) and molybdenum (Mo) and these silicide ($WSi_2$, $TiSi_2$, $MoSi_2$) respectively. It is also acceptable that the plugs are made of polysilicon or polycide made of these silicides. And the n-type fifth semiconductor region 16 is formed so that it surrounds the p-type second semiconductor region 13 and the n-type first semiconductor region 34. The n-type fifth semiconductor region 16 is formed so that it connects with the p-type fourth semiconductor region 12 formed along the second main surface and the n-type third semiconductor region 15 formed along the second main surface. The first main electrode layer 18 and the second main electrode layer 17 made of metal films such as aluminum (Al) are formed on the surfaces of the first main surfaces 11A and 11B of the silicon substrate 11 so that each makes ohmic contact. Furthermore, the main electrode layer 18 is connected with the n-type first semiconductor region 34 via the first main electrode plug 64. Similarly, the second main electrode layer 17 is connected with the p-type second semiconductor region 13 via the second main electrode plug 63.

As a result, the p-type second semiconductor region 13 and the n-type first semiconductor region 34 intervene in a region between the p-type fourth semiconductor region 12 formed at the whole second main surface 11A side of the silicon substrate 11 and the n-type third semiconductor region 15 formed at the whole first main surface 11B and in the flat center of the semiconductor diode 10d. And the n-type fifth semiconductor region 16 having impurity concentration (relatively low impurity concentration) inherent to the silicon substrate is formed around the p-type second semiconductor region 13 and the n-type first semiconductor region 34 so that it surrounds the p-type second semiconductor region 13 and the first semiconductor region 34.

Though the figures are omitted, similarly to FIG. 2A and FIG. 4, the semiconductor diode 10d is formed in such a way that a chip outer-surface is almost perpendicular to both main surfaces of the silicon substrate 11 so as to form the rectangular parallelepiped shape. As a result, an end portion of the second pn junction interface (the pn junction interface between the p-type fourth semiconductor region 12 with the n-type fifth semiconductor region 16 with relatively low impurity concentration) emerges on the chip outer-surface similarly to the first and second embodiments.

In the semiconductor diode 10d of the third embodiment, the n-type first semiconductor region 34 having predetermined impurity concentration $N_B$ specified by the Eq. (1) is connected with the p-type second semiconductor region 13 swelled from the center portion of the p-type fourth semiconductor region 12 and forms the first pn junction interface localized and confined inside the substrate 11. Therefore, if the occurrence of breakdown in a device having the first pn junction interface localized and confined inside and the second pn junction interface at the surrounding part exposing on the chip outer-surface is observed by applying a reverse bias voltage between the first main electrode layer 18 and the second main electrode layer 17, the first pn junction interface is found to cause breakdown earlier than the second pn junction interface disposed at surrounding region. This is because that the breakdown originates from the highest field intensity position. That is, the field intensity at the first pn-junction having higher impurity concentration of the n-type semiconductor regions 34 is higher than that of the second pn junction having lower impurity concentration of the n-type semiconductor region 6. That is, in the third embodiment, even if there is a part where the second pn junction interface emerges outside, the breakdown occurs in the first pn junction interface localized and confined inside and there is no bearing of surface field intensity acted on the second pn junction interface between the part exposing outside.

By forming the first main electrode plug 64 and the second main electrode plug 63, there is an advantage that metal electrode layers can be connected directly with the n-type first semiconductor region 34 and the p-type second semiconductor region 13 respectively. In FIG. 6, a principal operating region to serve as a current path of the main current of the semiconductor elements is identified between the first main electrode plug 64 and the second main electrode plug 63. Furthermore, since the metal electrode layers can contact the semiconductor regions over very wide areas including the first main electrode layer 18 and the second main electrode layer 17, the contact resistances resulting from ohmic contacts can be lowered. Therefore, the influence of parasitic resistance can be much lowered to obtain a voltage regulator diode with higher accuracy. Since others are essentially the same as the semiconductor diode 10a used in the first embodiment and function approximately the same way, repeating explanations is avoided.

Next, a manufacturing method for the semiconductor diode 10d of the third embodiment is explained by using a sequence of process cross-sectional views shown in FIG. 7A to FIG. 7D.

Figure 7A:
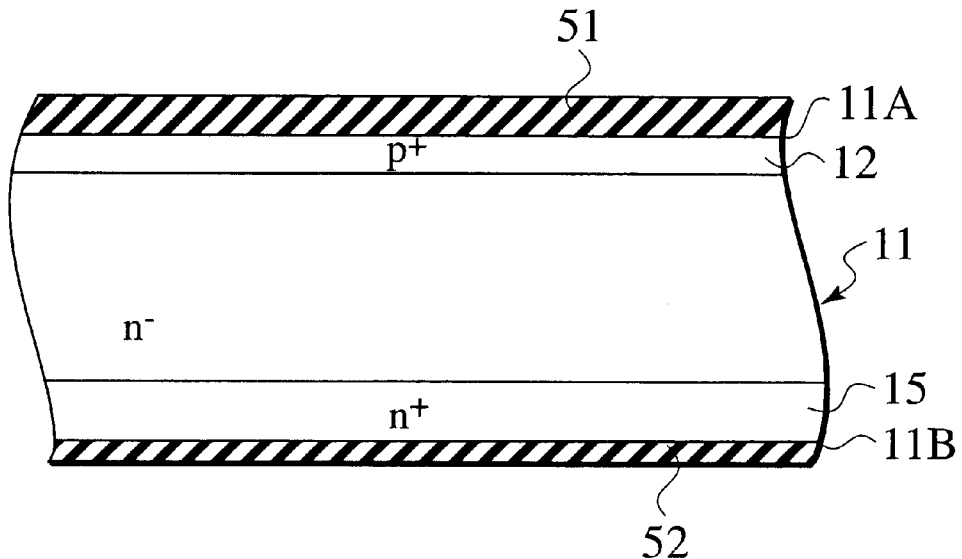
FIGS. 7A to 7D are process cross-sectional views showing a manufacturing method of the semiconductor device according to the third embodiment of the present invention.

(a) First, the first conductive (n-type) silicon substrate (silicon wafer) 11 is prepared. The main surface 11B and the second main surface 11A of the silicon substrate are thermal-oxidized to form silicon oxide films with a thickness of 800 nm to 2.0 μm respectively. Then the second main surface 11A of the silicon substrate 11 is coated with photoresist to remove the silicon oxide film of the first main surface 11B of the silicon substrate. And, by the pre-deposition method, donor impurities are diffused at the whole first main surface 11B of the silicon substrate 11 to form the n-type third semiconductor region 15 having high impurity concentration. By the driven-in treatment in an oxidizing ambient, a silicon oxide film 52 with a thickness of 800 nm to 2.0 μm is formed on the first main surface 11B of the silicon substrate 11. After this, the first main surface 11B of the silicon substrate is coated with photoresist to remove the silicon oxide film of the second main surface 11A of the silicon substrate. Then, by the pre-deposition method, accepter impurities are introduced from the second main surface 11A, and the driven-in treatment in an oxidizing ambient forms the p-type fourth semiconductor region 12 having high impurity concentration along the whole surface as shown in FIG. 7A. At this time, a new silicon oxide film 51 with a thickness of 300 nm to 1.5 μm is formed on the second main surface 11A of the silicon substrate 11 as shown in FIG. 7A. Whichever can be employed in first of the process sequence to form either the third semiconductor region 15 or the fourth semiconductor region 12.

Figure 7B:
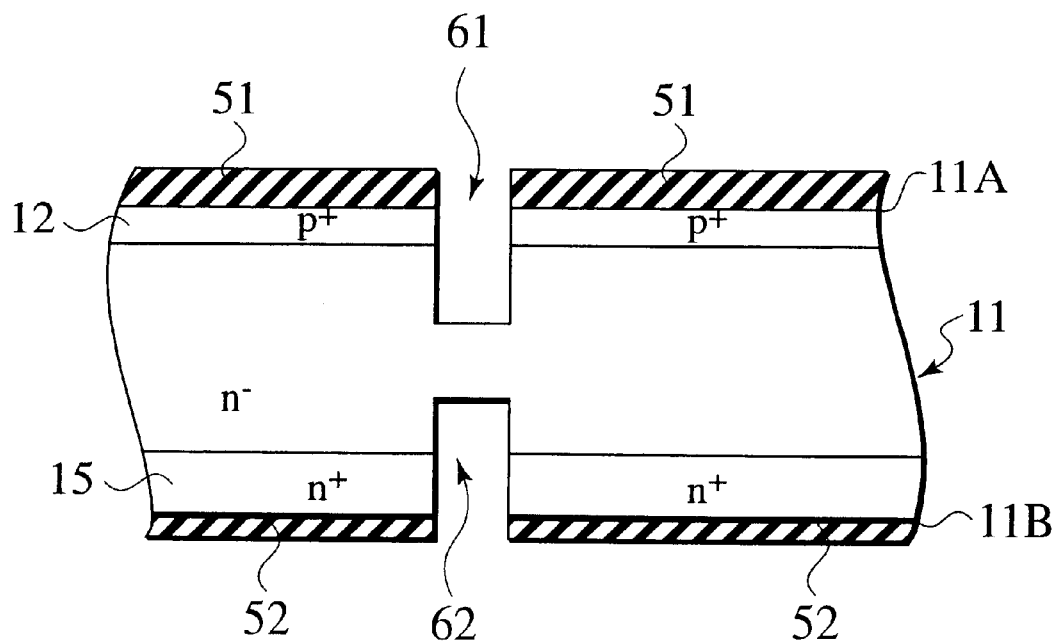

(b) Then the silicon oxide film 52 on the first main surface 11B is etched selectively by using photolithographic techniques and reactive ion etching (RIE) so as to expose a part of the first main surface 11B of the silicon substrate 11. After removing the photoresist used for selectively etching the silicon oxide film 52, the silicon oxide film 52 is used as an etching mask to form a first diffusion trench 62 as shown in FIG. 7B by the RIE or electron cyclotron resonance (ECR) ion etching, using e.g. etching gas such as boron trioxide (BCl₃), silicon tetrachloride (SiCl₄) and phosphorus trioxide (PCl₃). The first diffusion trench 62 is formed e.g. 100 μm to 150 μm in depth to pass through the n-type third semiconductor region 15. Similarly, a second diffusion trench 61 as shown in FIG. 7B is formed on the second main surface 11A of the silicon substrate 11 by using the silicon oxide film as a patterned etching mask. The second diffusion trench 61 is formed e.g. 100 μm to 150 μm in depth to pass through the p-type fourth semiconductor region 12.

Figure 7C:
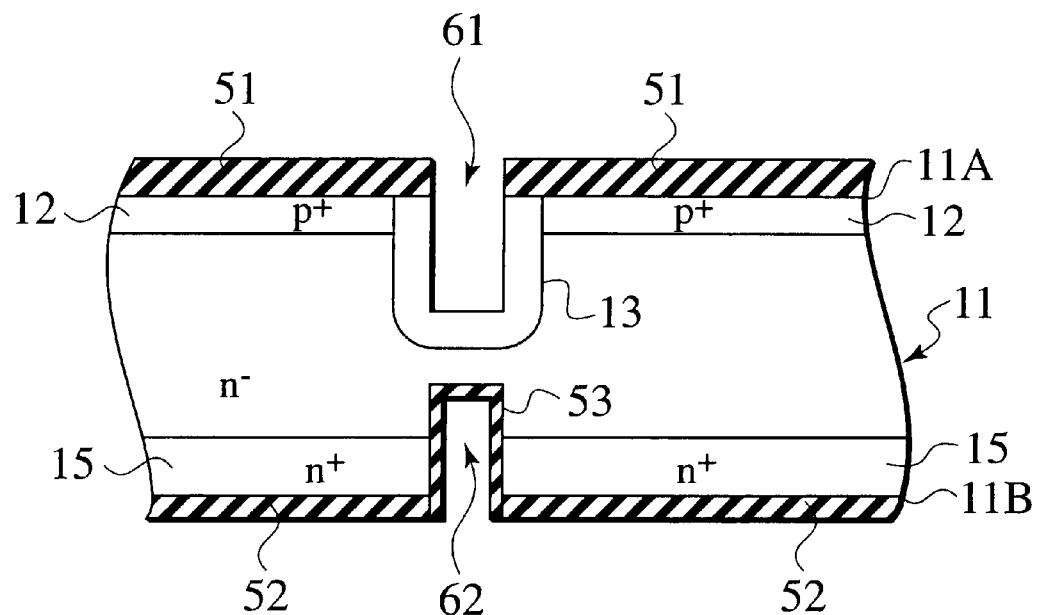

(c) Then the silicon substrate 11 is thermal-oxidized to form a new silicon oxide film 53 with a thickness of 300 nm to 600 nm inside the first diffusion trench 62 and the second diffusion trench 61. After that, photoresist is coated on the second main surface 11A of the silicon substrate 11 to remove again only the photoresist on a position of the second diffusion trench 61 by photolithographic techniques. In this case, the first main surface 11B of the silicon substrate is coated with the photoresist to protect the new silicon oxide film 53, removing selectively the silicon oxide film inside the second diffusion trench 61. For the silicon substrate 11 exposed on an internal wall and at the bottom of the second diffusion trench 61, accepter impurities are introduced by the pre-deposition method, and driven-in to a predetermined diffusion depth of e.g. 10 μm to 15 μm so that the p-type second semiconductor region 13 having high impurity concentration as shown in FIG. 7C is selectively formed around the second diffusion trench 61. As the result, the fourth semiconductor region 12 is connected with the second semiconductor region 13 at an upper part of the second outer surface near the third end surface. However, the fourth semiconductor region 12 may connect with the second semiconductor region 13 at the third end surface, or at the top surface of the second semiconductor region 13, if the impurity concentration of the fourth semiconductor region 12 is higher than the impurity concentration of the second semiconductor region 13, because the accepter impurities for the fourth semiconductor region 12 will diffuse into the upper part of the second semiconductor region 13 so as to change the boundary between the fourth semiconductor region 12 and the second semiconductor region 13, shrinking the area for the second semiconductor region 13.

Figure 7D:
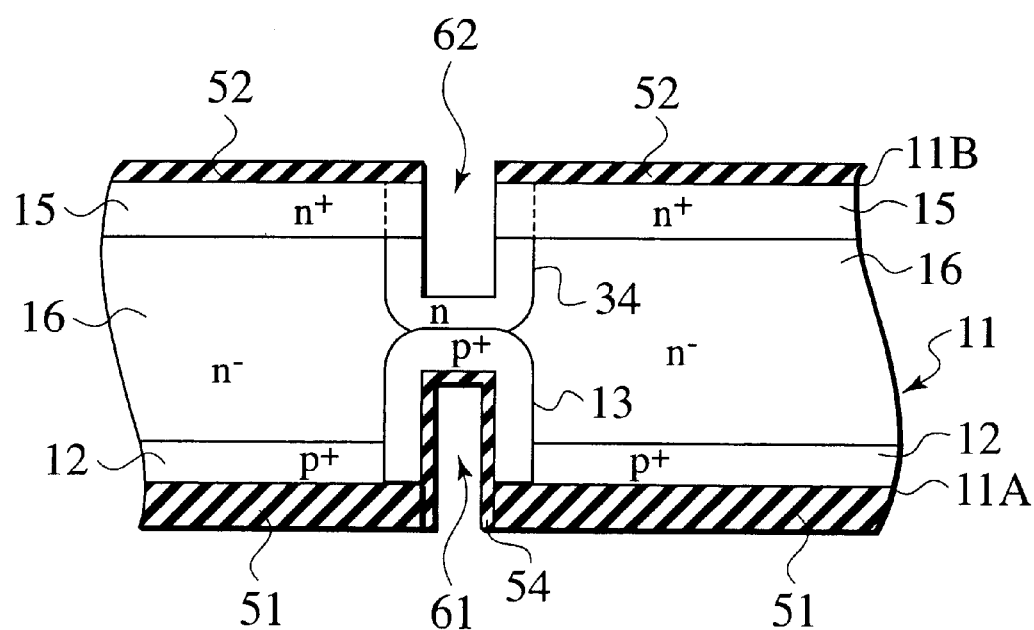

(d) An oxidation film 54 with a thickness of 300 nm to 600 nm is formed inside the second diffusion trench 61 by the driving-in treatment in the oxidizing ambient so as to obtain the required depth of the p-type second semiconductor region 13. After that, a new photoresist is coated on the first main surface 11B of the silicon substrate 11. Then the photoresist is delineated so as to expose the first diffusion trench 62 by photolithographic technique. Additionally, the second main surface 11A of the silicon substrate 11 is coated with photoresist so as to protect the oxidation film 54, removing selectively the silicon oxide film inside the first diffusion trench 62. For the silicon substrate 11 exposed on an internal wall and at the bottom of the first diffusion trench 62, the donor impurities are introduced by the pre-deposition method. And the driving-in treatment is executed so as to obtain a predetermined diffusion depth of e.g. 30 μm to 50 μm of the n-type first semiconductor region 34 as shown in FIG. 7D. Then the n-type first semiconductor region 34 having high impurity concentration is selectively formed around the first diffusion trench 62. At this time, p-type second semiconductor region 13 is also diffused further deep. As a result, as shown in FIG. 7D, the first pn junction interface is localized between the n-type first semiconductor region 34 and the second semiconductor region 13. It is acceptable to form the first semiconductor region 34 earlier to the second semiconductor region 13.

(e) After that, refractory metals such as W, Ti and Mo and these silicides ($WSi_2$, $TiSi_2$, $MoSi_2$) are selectively deposited by the selective CVD method inside the first diffusion trench 62 and the second diffusion trench 61 to bury the first main electrode plug 64 and the second main electrode plug 63 respectively inside the first diffusion trench 62 and the second diffusion trench 61. It is also acceptable to deposit, by the blanket CVD method, the refractory metals or these silicides on the whole surface, followed by the planarizing process such as the etch back process or chemical machine polishing (CMP) process to bury the refractory metals or these silicides in the first and second diffusion trenches 62 and 61. If the fourth semiconductor region 12 is connected with the second semiconductor region 13 at the third end surface, for the case that the impurity concentration of the fourth semiconductor region 12 is higher than the impurity concentration of the second semiconductor region 13, the second main electrode plug 63 penetrates the fourth semiconductor region 12 so as to bury the second diffusion trench 61.

Since the processes hereafter are the same as described in FIG. 3J and beyond in the first embodiment, further explanation is omitted.

It is also possible to form the third semiconductor region 15 and the fourth semiconductor region 12, after forming the first semiconductor region 34 and the second semiconductor region 13 inside the first diffusion trench 62 and the second diffusion trench 61.

According to the manufacturing method for the semiconductor diode 10d of the third embodiment, since the first semiconductor region 34 and the second semiconductor region 13 are formed in the semiconductor substrate 11 via the first diffusion trench 62 and the second diffusion trench 61, thermal diffusion treatment at a high diffusion temperature and for a long diffusion time is not necessary to improve productivity. And crystallographic defects resulting from the thermal diffusion treatment at a high diffusion temperature and for a long diffusion time will not occur. And since it needs relatively shallow diffusion, the impurity concentration of the first semiconductor region 34 and the second semiconductor region 13 can be easily controlled.

(Other Embodiments)

Various modifications will become possible for those skilled in the art after receiving the teaching of the present disclosure without departing from the scope thereof. For example, in the process shown in FIG. 3B, when the silicon oxide film 21 on the second main surface 11A is etched to form the diffusion window for selective diffusion, photoresist (figure is omitted) is coated on the silicon oxide film 41 on the first main surface 11B side for protecting the silicon oxide film 41. In this case, it is also acceptable to remove totally the silicon oxide film 41 without protecting the silicon oxide film 41 on the first main surface 11B side. It is acceptable to form the n-type third semiconductor region 15 by diffusing the n-type impurity elements at the whole first main surface 11B of the silicon substrate 11 at the same time when the n-type impurity elements is diffused selectively on the opening 21A of the silicon oxide film 21 to form the first semiconductor region 14. The number of process steps can be reduced this way.

Although the voltage regulator diode is explained as an example of the semiconductor diode in the first to third embodiments, it is naturally possible to apply the present invention to a power semiconductor device having higher maximum operating voltage than the voltage regulator diode.

Thus, the present invention of course includes various embodiments and modifications and the like which are not detailed above. Therefore, the scope of the present invention will be defined in the following claims.

What is claimed is:

1. A semiconductor device comprising:
   a first semiconductor region of a first conductivity type, defined by a first end surface, a second end surface opposing to the first end surface and a first outer surface connecting the first and second end surfaces;
   a second semiconductor region of a second conductivity type, defined by a third end surface, a fourth end surface opposing to the third end surface and a second outer surface connecting the third and fourth end surfaces, the fourth end surface being in contact with the first end surface;
   a third semiconductor region of the first conductivity type having an impurity concentration higher than the first semiconductor region connected with the first semiconductor region at the second end surface, the perimeter of the third semiconductor region serving as a part of the chip outer surface;
   a fourth semiconductor region of the second conductivity type connected with the second semiconductor region at the third end surface, the perimeter of the fourth semiconductor region serving as another part of the chip outer surface so that a pn junction interface between the third and fourth semiconductor regions terminates at the chip outer surface; and
   a fifth semiconductor region having an inner surface in contact with the first and second outer surfaces and an impurity concentration lower than the first semiconductor region, configured such that the fifth semiconductor region surrounds the first and second semiconductor regions, the fifth semiconductor region being disposed between the third and fourth semiconductor regions.

2. The semiconductor device of claim 1, wherein an outer surface of the fifth semiconductor region serves as a still another part of the chip outer surface of the semiconductor device and the chip outer surface is substantially orthogonal with the second end surface of the first semiconductor region.

3. The semiconductor device of claim 1, wherein the fifth semiconductor region is made of a wafer cut from bulk crystal.

4. The semiconductor device of claim 1, further comprising a first main electrode layer formed on a bottom surface of the third semiconductor region, and a second main electrode layer formed on a top surface of the fourth semiconductor region.

5. A semiconductor device comprising:
   a first semiconductor region of a first conductivity type, defined by a first end surface, a second end surface opposing to the first end surface and a first outer surface connecting the first and second end surfaces;

a second semiconductor region of a second conductivity type, defined by a third end surface, a fourth end surface opposing to the third end surface and a second outer surface connecting the third and fourth end surfaces, the fourth end surface being in contact with the first end surface;

a third semiconductor region of the first conductivity type connected with the first semiconductor region at the second end surface;

a fourth semiconductor region of the second conductivity type connected with the second semiconductor region at the third end surface;

a fifth semiconductor region having an inner surface in contact with the first and second outer surfaces and an impurity concentration lower than the first semiconductor region, configured such that the fifth semiconductor region surrounds the first and second semiconductor regions, the fifth semiconductor region being disposed between the third and fourth semiconductor regions;

a first main electrode layer formed on a bottom surface of the third semiconductor region;

a second main electrode layer formed on a top surface of the fourth semiconductor region; and a first main electrode plug penetrating the fourth semiconductor region and buried in the first semiconductor region so as to contact with the first main electrode layer, the first main electrode plug having electric conductivity higher than the electric conductivity of the first semiconductor region.

6. A semiconductor device comprising:

a first semiconductor region of a first conductivity type, defined by a first end surface, a second end surface opposing to the first end surface and a first outer surface connecting the first and second end surfaces;

a second semiconductor region of a second conductivity type, defined by a third end surface, a fourth end surface opposing to the third end surface and a second outer surface connecting the third and fourth end surfaces, the fourth end surface being in contact with the first end surface;

a third semiconductor region of the first conductivity type connected with the first semiconductor region at the second end surface;

a fourth semiconductor region of the second conductivity type connected with the second semiconductor region at the third end surface;

a fifth semiconductor region having an inner surface in contact with the first and second outer surfaces and an impurity concentration lower than the first semiconductor region, configured such that the fifth semiconductor region surrounds the first and second semiconductor regions, the fifth semiconductor region being disposed between the third and fourth semiconductor regions;

a first main electrode layer formed on a bottom surface of the third semiconductor region;

a second main electrode layer formed on a top surface of the fourth semiconductor region; and a second main electrode plug buried in the second semiconductor region so as to contact with the second main electrode layer, the second main electrode plug having electric conductivity higher than the electric conductivity of the second semiconductor region.

7. The semiconductor device of claim 1, wherein the fifth semiconductor region has the first conductivity type.

8. A semiconductor device terminating a pn junction interface at a chip outer surface comprising:

a first semiconductor region of a first conductivity type, defined by a first end surface, a second end surface opposing to the first end surface and a first outer surface connecting the first and second end surfaces;

a second semiconductor region of the second conductivity type, defined by a third end surface, a fourth end surface opposing to the third end surface and a second outer surface connecting the third and fourth end surfaces, the fourth end surface being in contact with the first end surface;

a third semiconductor region of the first conductivity type having an impurity concentration higher than the first semiconductor region connected with the first semiconductor region at the second end surface, the perimeter of the third semiconductor region serving as a part of the chip outer surface;

a fourth semiconductor region of the second conductivity type connected with an upper part of the second outer surface near the third end surface, the perimeter of the fourth semiconductor region serving as another part of the chip outer surface so that a pn junction interface between the third and fourth semiconductor regions terminates at the chip outer surface; and a fifth semiconductor region having an inner surface in contact with the first and second outer surfaces and an impurity concentration lower than the first semiconductor region, configured such that the fifth semiconductor region surrounds the first and second semiconductor regions, the fifth semiconductor region being disposed between the third and fourth semiconductor regions.

9. A semiconductor device of claim 8, wherein an outer surface of the fifth semiconductor region serves as a still another part of the chip outer surface of the semiconductor device and the chip outer surface is substantially orthogonal with the second end surface of the first semiconductor region.

10. The semiconductor device of claim 8, wherein the fifth semiconductor region is made of a wafer cut from bulk crystal.

11. The semiconductor device of claim 8, further comprising a first main electrode layer formed on a bottom surface of the third semiconductor region, and a second main electrode layer formed on a top surface of the fourth semiconductor region.

12. A semiconductor device comprising:

a first semiconductor region of a first conductivity type, defined by a first end surface, a second end surface opposing to the first end surface and a first outer surface connecting the first and second end surfaces;

a second semiconductor region of the second conductivity type, defined by a third end surface, a fourth end surface opposing to the third end surface and a second outer surface connecting the third and fourth end surfaces, the fourth end surface being in contact with the first end surface;

a third semiconductor region of the first conductivity type connected with the first semiconductor region at the second end surface;

a fourth semiconductor region of the second conductivity type connected with an upper part of the second outer surface near the third end surface;

a fifth semiconductor region having an inner surface in contact with the first and second outer surfaces and an impurity concentration lower than the first semiconductor region, configured such that the fifth semiconductor region surrounds the first and second semiconductor regions, the fifth semiconductor region being disposed between the third and fourth semiconductor regions;

a first main electrode layer formed on a bottom surface of the third semiconductor region;

a second main electrode layer formed on a top surface of the fourth semiconductor region; and a first main electrode plug buried in the first semiconductor region so as to contact with the first main electrode layer, the first main electrode plug having electric conductivity higher than the electric conductivity of the first semiconductor region.

13. A semiconductor device comprising:

a first semiconductor region of a first conductivity type, defined by a first end surface, a second end surface opposing to the first end surface and a first outer surface connecting the first and second end surfaces;

a second semiconductor region of the second conductivity type, defined by a third end surface, a fourth end surface opposing to the third end surface and a second outer surface connecting the third and fourth end surfaces, the fourth end surface being in contact with the first end surface;

a third semiconductor region of the first conductivity type connected with the first semiconductor region at the second end surface;

a fourth semiconductor region of the second conductivity type connected with an upper part of the second outer surface near the third end surface;

a fifth semiconductor region having an inner surface in contact with the first and second outer surfaces and an impurity concentration lower than the first semiconductor region, configured such that the fifth semiconductor region surrounds the first and second semiconductor regions, the fifth semiconductor region being disposed between the third and fourth semiconductor regions;

a first main electrode layer formed on a bottom surface of the third semiconductor region;

a second main electrode layer formed on a top surface of the fourth semiconductor region; and a second main electrode plug buried in the second semiconductor region so as to contact with the second main electrode layer, the second main electrode plug having electric conductivity higher than the electric conductivity of the second semiconductor region.

14. The semiconductor device of claim 8, wherein the fifth semiconductor region has the first conductivity type.

* * * * *